United States Patent
Jones et al.

(10) Patent No.: US 10,743,376 B2
(45) Date of Patent: Aug. 11, 2020

(54) HIGH POWER SWITCHING DEVICES FOR INDUCTIVE HEATING APPLICATIONS

(71) Applicant: ATSE, LLC, Northborough, MA (US)

(72) Inventors: Franklin B. Jones, Shrewsbury, MA (US); Eric D. Donahue, Sterling, MA (US); Andrew I. Nehring, Northborough, MA (US); Daniel T. Jones, Medford, MA (US); Robert A. Hummel, Cambridge, MA (US)

(73) Assignee: ATSE, LLC, Northborough, MA (US)

( * ) Notice: Subject to any disclaimer, the term of this patent is extended or adjusted under 35 U.S.C. 154(b) by 203 days.

(21) Appl. No.: 15/943,891

(22) Filed: Apr. 3, 2018

(65) Prior Publication Data

US 2018/0288833 A1 Oct. 4, 2018

Related U.S. Application Data

(60) Provisional application No. 62/481,443, filed on Apr. 4, 2017.

(51) Int. Cl.
| | |
|---|---|
| *H05B 6/06* | (2006.01) |
| *H02M 5/45* | (2006.01) |
| *H02M 3/335* | (2006.01) |
| *G05D 23/26* | (2006.01) |
| *H05B 6/36* | (2006.01) |

(Continued)

(52) U.S. Cl.
CPC ............ *H05B 6/06* (2013.01); *G05D 23/26* (2013.01); *H02M 7/003* (2013.01); *H02M 7/53875* (2013.01); *H05B 6/36* (2013.01); *H05B 2206/023* (2013.01); *H05B 2206/024* (2013.01); *H05K 2201/10166* (2013.01)

(58) Field of Classification Search
CPC .... H02M 7/003; H02M 7/53875; H05B 6/06; H05B 6/36; H05B 2206/023; H05B 2206/024; G05D 23/26; H05K 2201/10166
USPC ...... 219/677, 647.66, 661, 663, 670; 363/17, 363/37, 20, 34, 53, 35, 36, 97; 323/220, 323/223, 224, 226, 282, 283, 284; 426/231, 520
See application file for complete search history.

(56) References Cited

U.S. PATENT DOCUMENTS

| | | | |
|---|---|---|---|
| 5,429,725 A | * | 7/1995 | Thorpe .................. C22C 45/04 148/304 |
| 8,102,235 B2 | | 1/2012 | Hui et al. |
| 8,520,417 B2 | | 8/2013 | Erdman et al. |

(Continued)

FOREIGN PATENT DOCUMENTS

CN 203768403 U * 8/2014

OTHER PUBLICATIONS

Translation of CN 203768403 U, Steel tube continuous induction heat treatment equipment based on PID temperature closed-loop control. Aug. 13, 2014, ProQuestDocuments. (Year: 2014).*

(Continued)

*Primary Examiner* — Quang T Van
(74) *Attorney, Agent, or Firm* — Schmeiser, Olsen & Watts LLP; Timothy P. Collins

(57) ABSTRACT

A closed-loop cooling system is internal to the enclosure of an induction drive system. Two inverter modules of the induction drive system each includes three insulated gate bipolar transistor (IGBT) modules for producing an AC output from a DC source, the AC output received by an induction coil for heating a metal.

11 Claims, 23 Drawing Sheets

(51) Int. Cl.
*H02M 7/5387* (2007.01)
*H02M 7/00* (2006.01)

(56) References Cited

U.S. PATENT DOCUMENTS

| | | |
|---|---|---|
| 2005/0111246 A1 | 5/2005 | Lai et al. |
| 2005/0270806 A1 | 12/2005 | Zhu |
| 2007/0007929 A1 | 1/2007 | Lee et al. |
| 2008/0205089 A1 | 8/2008 | Zhu et al. |
| 2009/0128237 A1 | 5/2009 | Attwood et al. |
| 2015/0131353 A1 | 5/2015 | Nakajima |

OTHER PUBLICATIONS

Notice of Allowance in U.S. Appl. No. 16/010,119 dated Jun. 12, 2019; 8 pages.
Non-Final Office Action in U.S. Appl. No. 16/010,119 dated Dec. 14, 2018; 12 pages.
Non-Final Office Action in U.S. Appl. No. 15/398,756, dated May 24, 2017; 11 pages.
Final Office Action in U.S. Appl. No. 15/398,756, dated Nov. 29, 2017; 10 pages.
Notice of Allowance in U.S. Appl. No. 15/398,756, dated Mar. 27, 2018; 9 pages.

\* cited by examiner

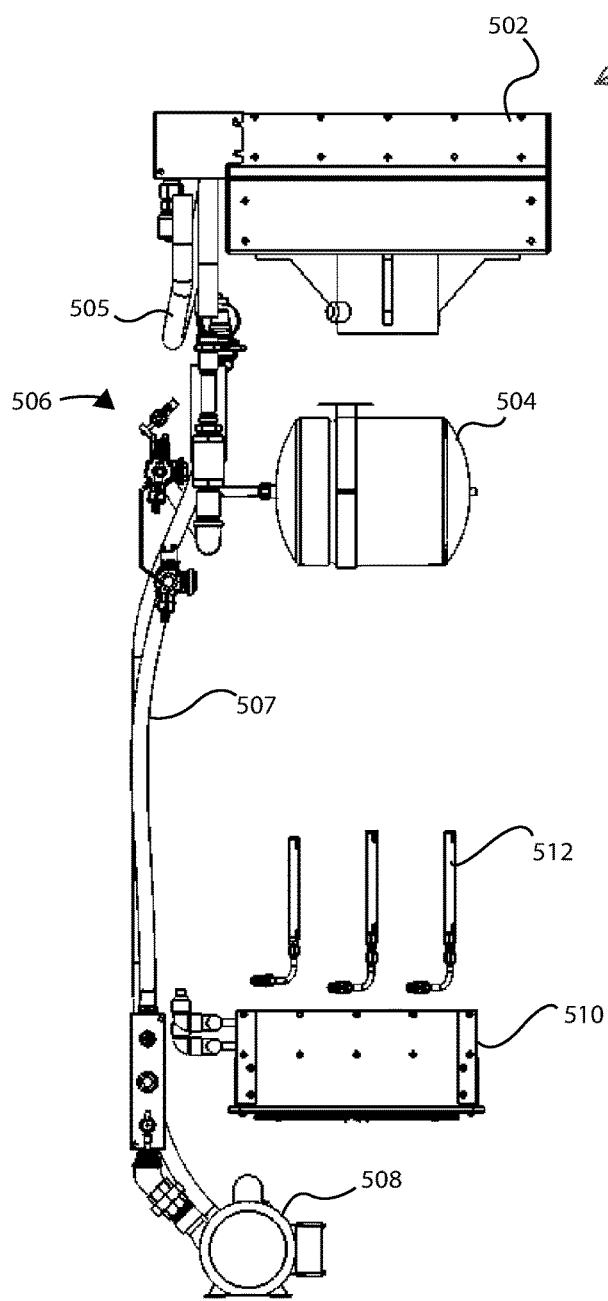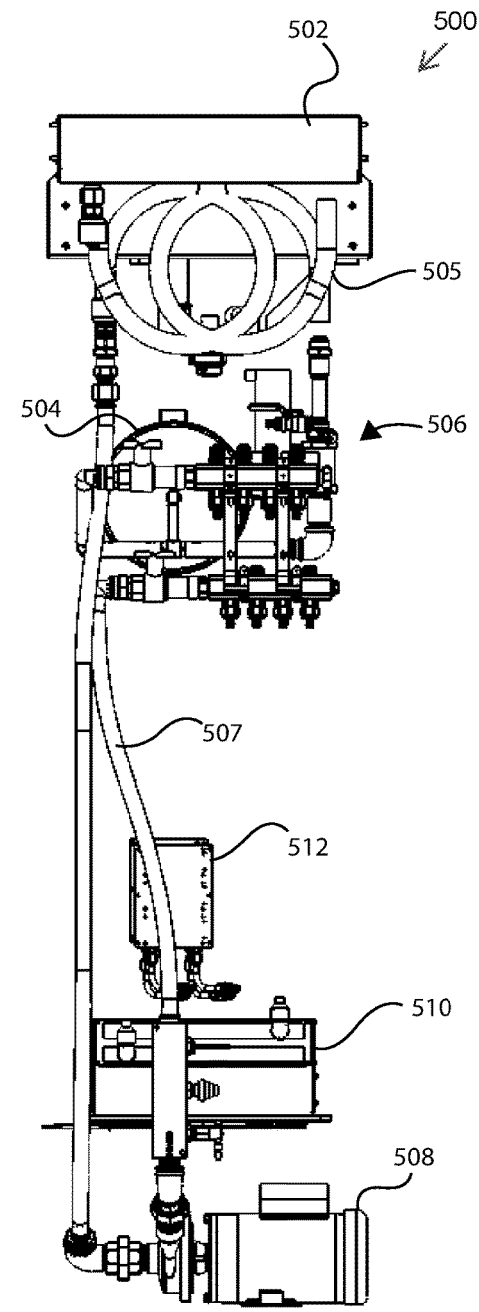
FIG. 5B
FIG. 5C

US 10,743,376 B2

HIGH POWER SWITCHING DEVICES FOR INDUCTIVE HEATING APPLICATIONS

FIELD

The present concepts relate generally to induction drive systems, and more specifically, to an induction drive system for an induction coil for heating steel below the Curie temperature.

BACKGROUND

Induction drives are used in a variety of industrial applications, including heating equipment. However, applications may vary with respect to the efficiency of power delivery. For example, some applications include the melting of various metals, such as aluminum, and deliver 40-50% of the received power to the load due to losses in the drive and coil, whereas other metals such as steel operate at 90-95% efficiency. Also, certain metals such as steel also do not require the stringent, complex configurations of conventional induction drives, especially when heating steel below the Curie temperature.

BRIEF SUMMARY

In one aspect, an induction drive system comprises an enclosure; a closed-loop cooling system internal to the enclosure;

In some embodiments, the induction drive system further comprises two inverter modules that each includes three insulated gate bipolar transistor (IGBT) modules for producing an AC output from a DC source, the AC output received by an induction coil for heating a metal.

In some embodiments, the inverter modules are arranged in parallel in an H-Bridge configuration for forming a current flow through a single-phase or three-phase load between the legs of the H-Bridge.

In some embodiments, the induction drive system is constructed and arranged for an application directed to heating steel below a Curie temperature.

In some embodiments, the three IGBT modules of each inverter module are parallel each other. In other embodiments the three IGBT modules of each inverter module are driving discrete windings in induction heating apparatus in a three phase system. In some embodiments, the inventor modules are constructed and arranged to drive a three-phase coil.

In some embodiments, the two inverter modules are arranged split the DC current draw between the IGBT modules of the inverter modules and the capacitor banks.

In some embodiments, the induction drive system produces a randomly varied output waveform period.

In some embodiments, the induction drive system further includes a controller for providing phase shifted square wave control.

In some embodiments, the induction drive system further includes a line reactor power filtering device.

BRIEF DESCRIPTION OF THE SEVERAL VIEWS OF THE DRAWINGS

The above and further advantages may be better understood by referring to the following description in conjunction with the accompanying drawings, in which like numerals indicate like structural elements and features in various figures. The drawings are not necessarily to scale, emphasis instead being placed upon illustrating the principles of the concepts.

FIGS. 5A-5C are perspective, front, and side views, respectively, of a cooling system of the inductor system of FIGS. 1A-1C, 2A, and 2B, in accordance with some embodiments.

DETAILED DESCRIPTION

Figure 1A:
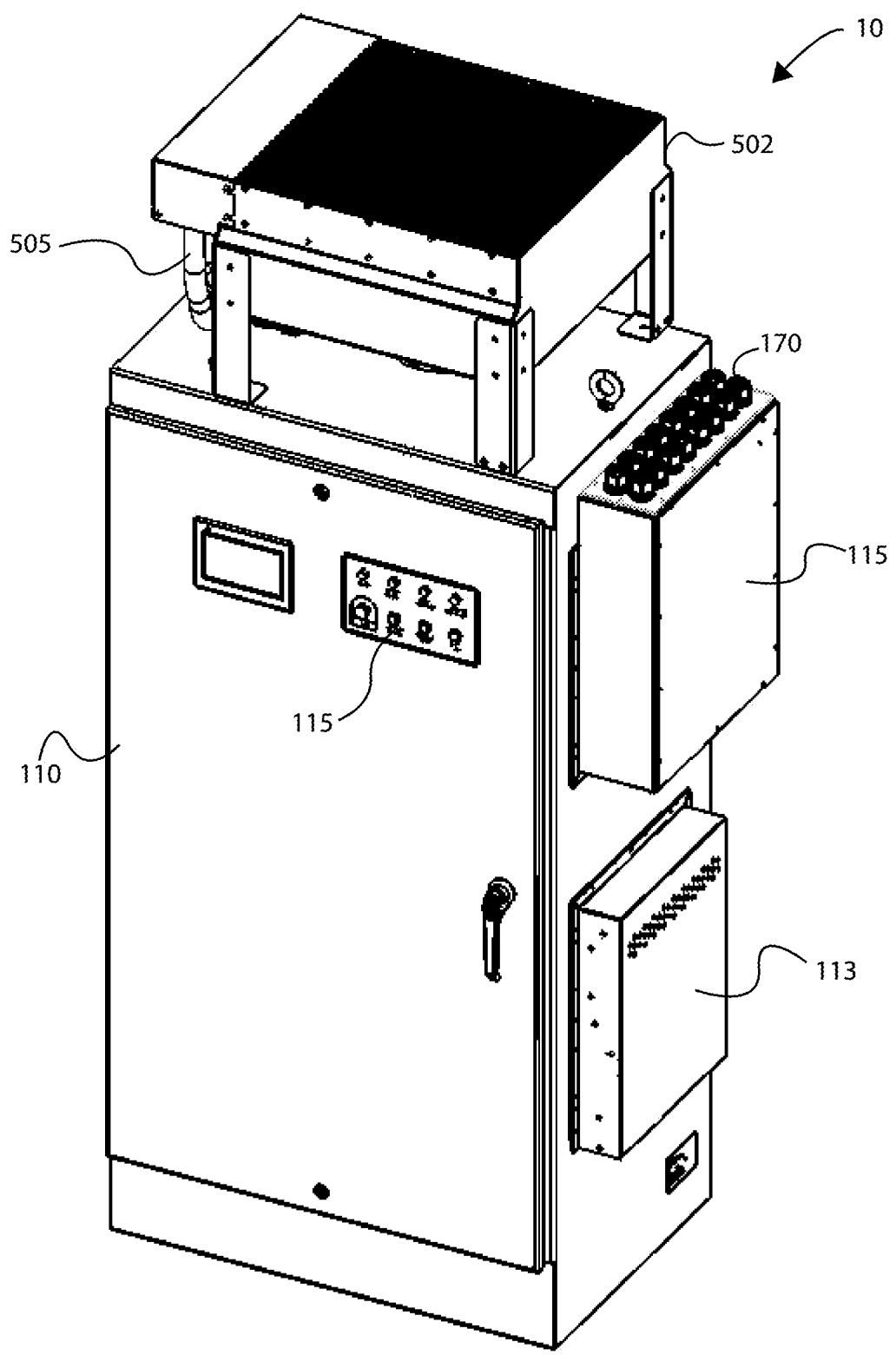
FIG. 1A is a perspective view of an induction drive system, in accordance with some embodiments.
Figure 1B:
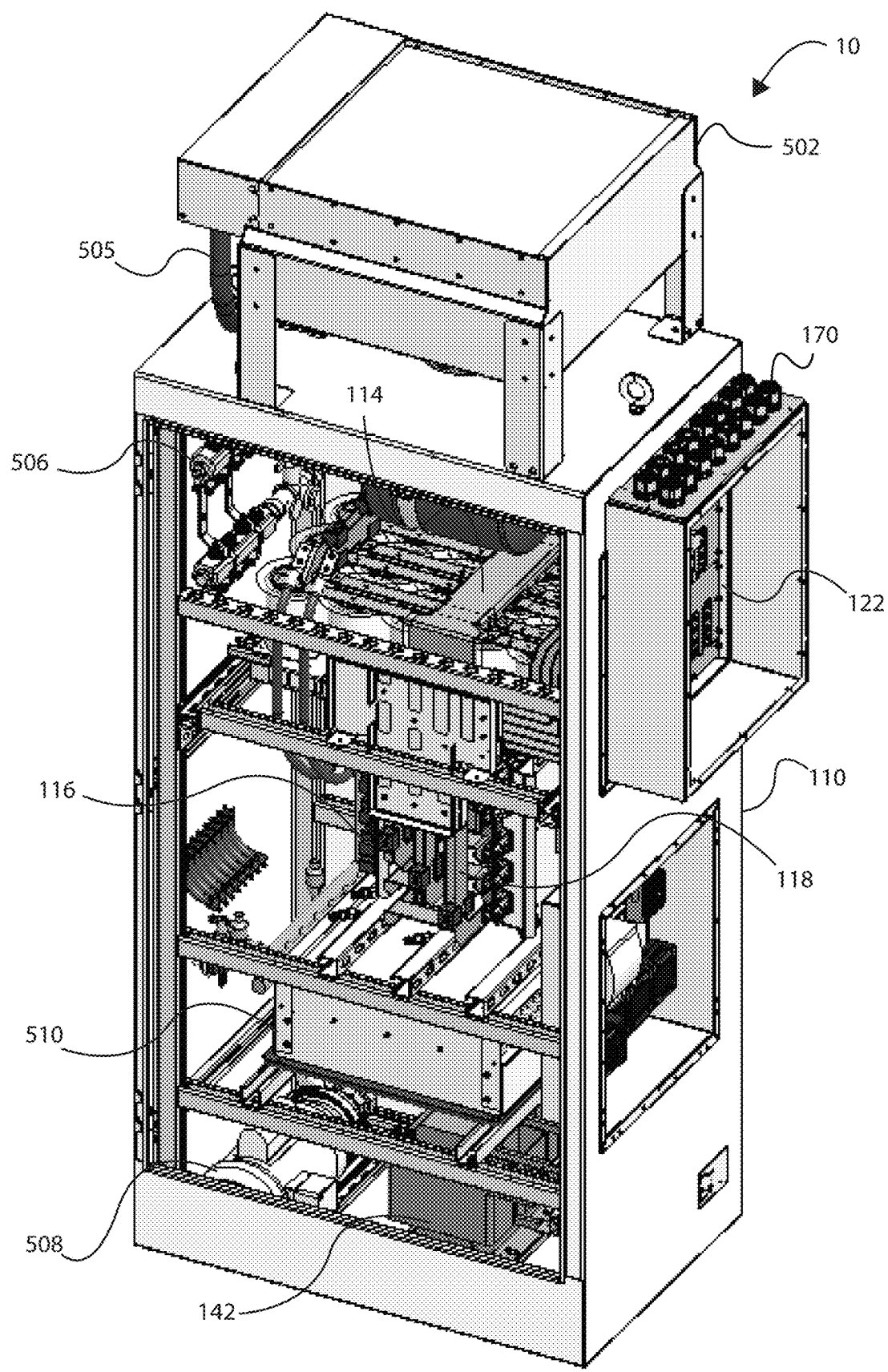
FIG. 1B is a perspective view of an interior of the induction drive system of FIG. 1A.

In brief overview, an induction drive is constructed and arranged to convert a source of input utility power into the controlled power signal, which may be output to an induction coil or the like. The induction drive includes a plurality of high power switching devices for contributing to outputting power to an induction coil or the like that contributes to the heating of steel, the change in the magnetic field generating the heat. The induction drive is constructed and arranged to accommodate a load that maintains its magnetic properties, allowing for a lower operating frequency. This results in the elimination of complex, expensive, heat-generating components from the drive, and simplifies the componentry of the induction drive.

In some embodiments, as shown in FIGS. 1A-5C and 7, an induction drive system 10 comprises an enclosure or housing 110 for housing both a closed-loop cooling system 500 (see FIGS. 5A-5C) and an electrical subassembly including power electronics (see FIGS. 3A and 3B), which are arranged in a coexisting manner inside the enclosure 110. Also arranged in the enclosure 110 is a control unit 112, DC buswork 114, rectifier 116, a capacitor bank 117, a set of inverter modules 118, and a line reactor 142, but not limited thereto. In some embodiments, the induction drive system 10 is constructed and arranged to produce a voltage of 800 VAC, a current of 900 Arms, and a frequency of 100 Hz to 2 kHz. In some embodiments, the induction drive system 10 is constructed and arranged to produce a voltage range of 120 VAC to 2 kVAC, a current range of 50 A rms to 5 kA rms, and a frequency range of 100 Hz to 5 kHz, but not limited thereto. The enclosure 110 may include a set of panels, doors, or other detachable enclosures, for example, a cover 115 over the output buswork 122, cable connectors 170 exposed for connecting cables according to a quadrature cable layout (shown in FIG. 8).

Figure 2A:
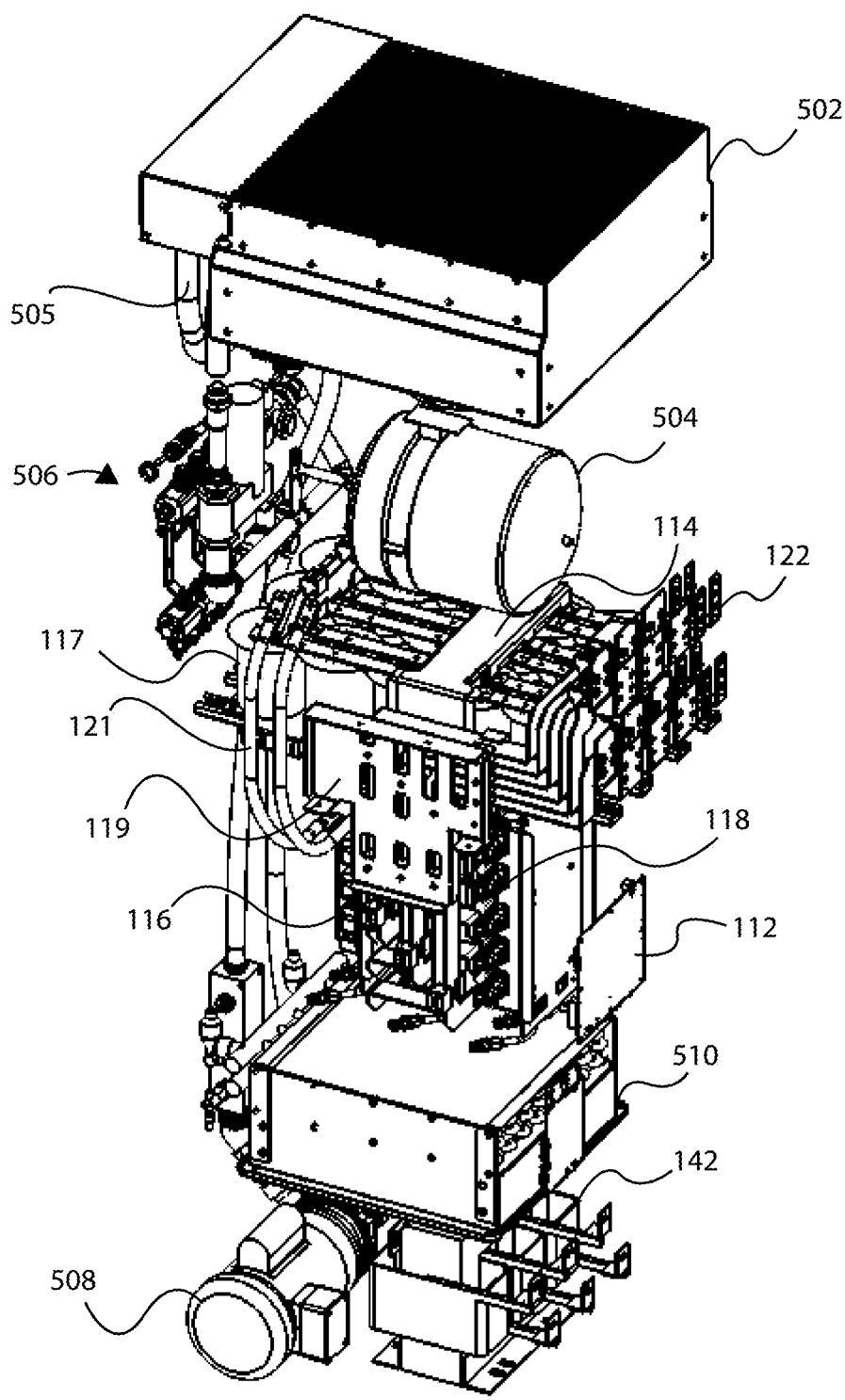
FIG. 2A is a perspective view of the interior of the induction drive system of FIGS. 1A-1C.
Figure 2B:
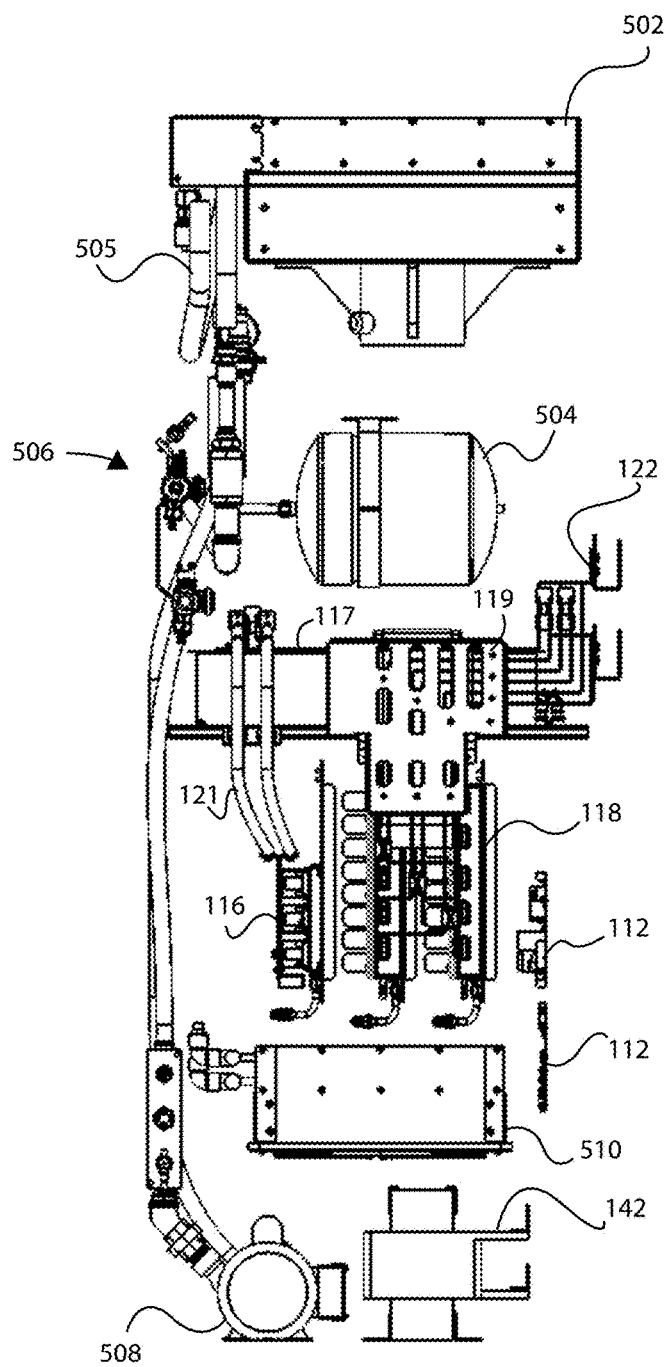
FIG. 2B is a front view of the interior of the induction drive system of FIGS. 1A-1C, and 2A.
Figure 2C:
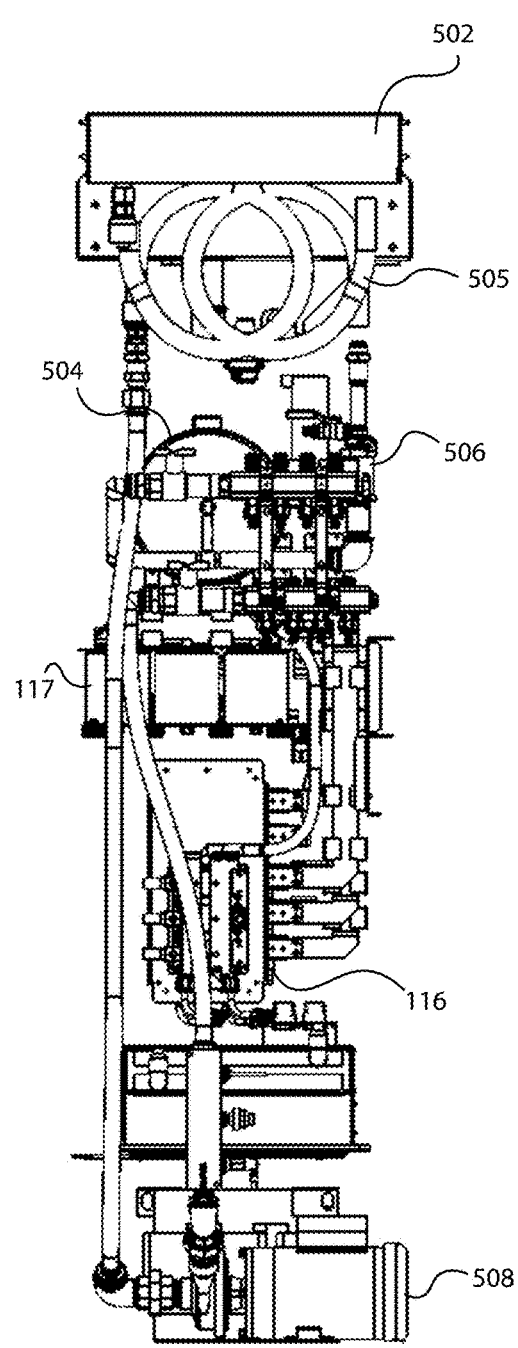
FIG. 2C is a side view of the interior of the induction drive system of FIGS. 1A-1C, 2A, and 2B.
Figure 3A:
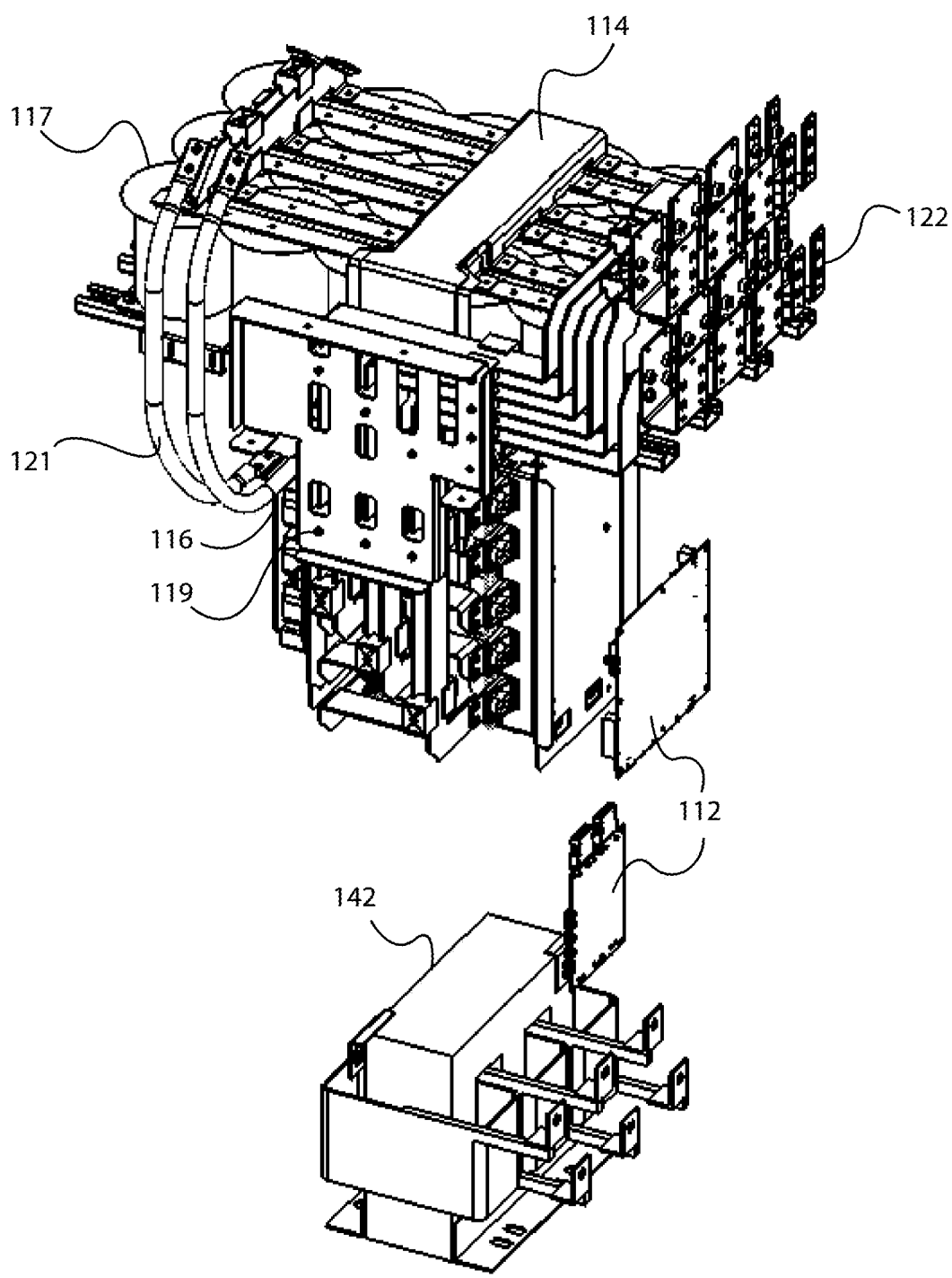
FIG. 3A is a perspective view of elements of the interior of the induction drive system of FIGS. 1A-1C, 2A, and 2B.
Figure 3B:
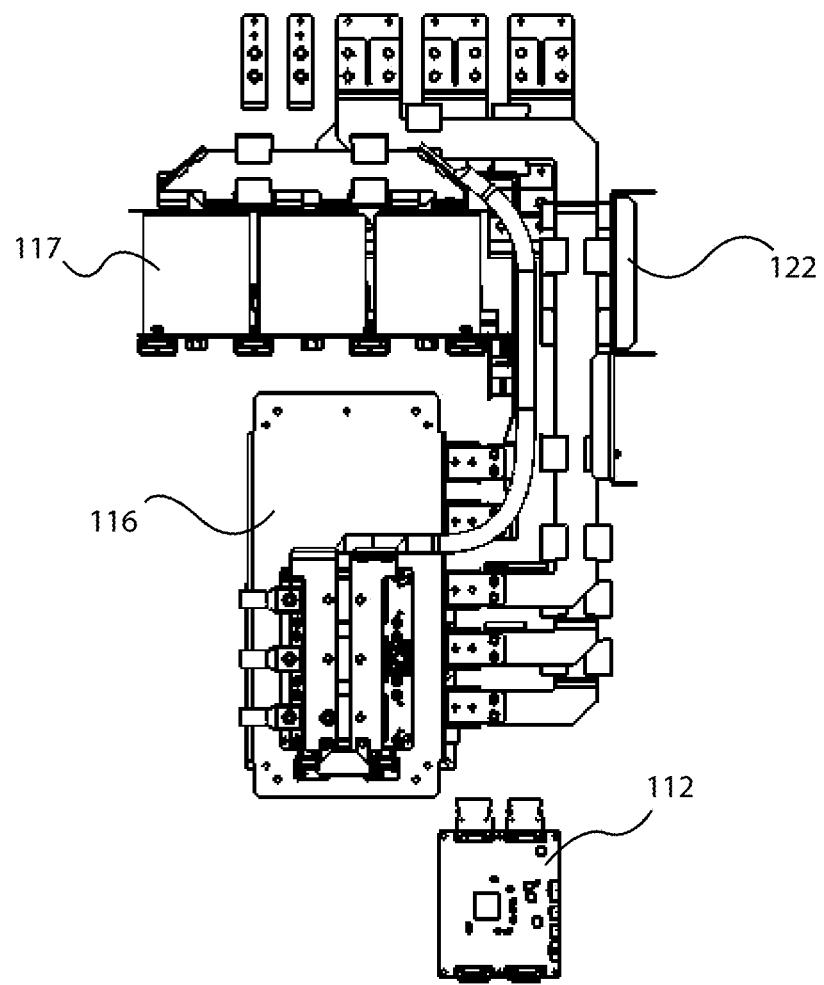
FIG. 3B is a side view of elements of the interior of the induction drive system of FIGS. 1A-1C, 2A, 2B, and 3A.
Figure 3B:
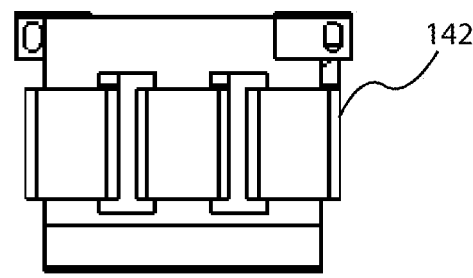

As shown in FIGS. 3A and 3B, the electrical subassembly configured for co-existence in the enclosure 110 may include DC buswork 114, an output buswork 122, a capacitor bank 117, a control circuit 112, a rectifier 116, a set of cables electrically coupling the capacitor bank 117 and the rectifier, a mounting plate 119 for the AC buswork As shown in FIGS. 1A, 1B, 2A-2C, and 5A-5C, the cooling system 500 is constructed and arranged for positioning in the enclosure 110, and for circulating water and/or other cooling fluid throughout the enclosure 110. The cooling system 500 may include but not be limited to an external radiator 502, a coolant tank 504, a manifold block 506, a pump 508, fluid transport lines 507, return lines 511, an internal radiator 510, and a set of inverter cold plates 512, a rectifier cold plate 513, a sensor block 514, and a set of inlets, outlets, pumps, switches, valves, sensors, and the like (not shown) for coupling with various other elements of a cooling system 500, any and all configured to operate together inside the enclosure 110, and to satisfy the cooling requirements of the induction drive system 10.

The radiator 502 is constructed and arranged to exchange heat between cooling fluid output from coolant tank 504 and an ambient environment, i.e., external to the enclosure 110. Internal radiator 510 on the other hand is constructed and arranged to remove heat from the environment in the enclosure 110, and to cool the enclosure interior. The fluid transport lines 507 may provide cooling fluid via the manifold block 506 from the pump 508 and to the external radiator 502. Distribution lines 511 output cool fluid from the manifold block 506 to the interior radiator 510 and cold plates 512, and return hot fluid to the manifold block 506 from these heat sources. The rectifier 116 may be mounted to the cold plates 512 and the inverter modules 118 include a cold plate 512 within their packaging. The cold plates 512 are preferably a liquid cooling cold plate that provides a flow path for IGBT modules 152 internal to the inverter 118. The inverter modules 118 and/or other electronic components can generate a significant amount of heat. After heat generated by these components, and possibly other components of the system 10, is absorbed into the liquid, the heated liquid is removed from the enclosure 110 via cooling fitting coupled to an attached hose 505 to the external radiator 502, where the heat is transferred to the external ambient air.

The flow of fluid through a heat exchange loop comprising elements of the cooling system 500 can be controlled by a controller, for example, controlling the operation of the pump 508 for circulating the fluid through the heat exchange loop or the operation of the fan in the external radiator 502 for cooling the fluid. A flow may be controlled by a switch on the front of the enclosure 110, and may be tied to interlock circuits in the controller 112 to control utility power.

As described above, the closed-loop cooling system 500 operates inside the enclosure 110 to sufficiently remove heat from the enclosure due to a reduced heat load generated by the electrical components co-located in the enclosure 110.

As shown in FIGS. 1A, 1B, 2A-2C, 4A, 4B, and 7, an inverter module 118 includes an array or bank of DC capacitors 151, a plurality of high power switching modules 152, for example, insulated gate bipolar transistor (IGBT) modules, or "IGBT modules," or related solid state devices, and a gate driver board 153 comprising relevant circuitry. In preferred embodiments, two inverters 118 are implemented, each including three IGBT modules 152, which operate in parallel, for example, as phases of a three-phase system. In some embodiments the three IGBT modules 152 of each inverter module drive discrete windings in induction heating apparatus in a three phase system. In some embodiments, the inventor modules 118 are constructed and arranged to drive a three-phase coil. The control board 112 controls the operation of the inverter modules 118, for example, to operate in parallel. In some embodiments, three IGBT modules 152 and a pair of switches are positioned on either side of the induction coil 40, for a total of six modules. Other embodiments may include additional switches operating in parallel, or a single inverter 118. The IGBT modules 152 may be similar those described in U.S. patent application Ser. No. 15/398,756 entitled "Power Converter," the contents of which are incorporated by reference herein in their entirety, for example, an H-bridge configuration. The module arrangement allows for use of standard inverters. In some embodiments, the inverter modules are arranged in parallel in an H-Bridge configuration for forming a current flow through a single-phase or three-phase load between the legs of the H-Bridge. The H-bridge is constructed and arranged to generate a voltage waveform across the coil at plus/minus DC bus voltage.

The DC capacitor array 151 may be mounted to a frame or case for positioning over the IGBT modules 152. As described herein, the IGBT modules 152 can be positioned on a cold plate 512, heat sink, or related heat dissipation surface.

Figure 7:
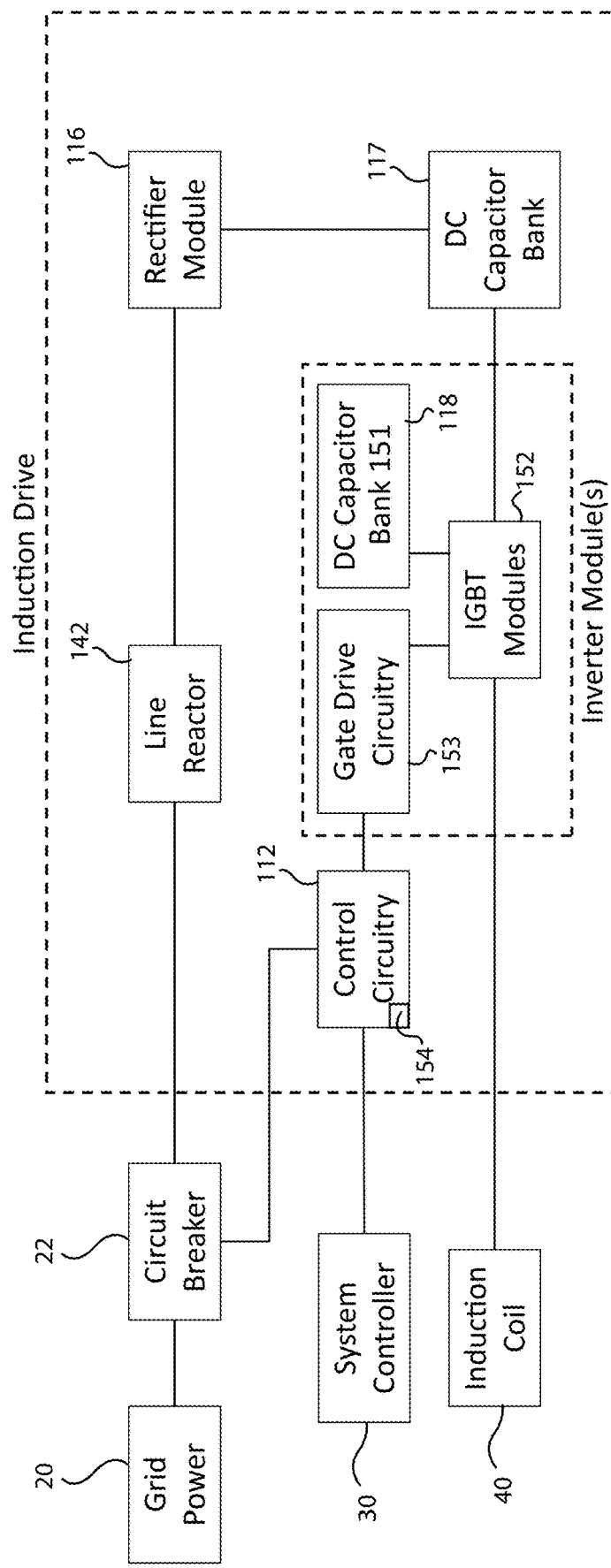
FIG. 7 is a block diagram of an induction drive, in accordance with some embodiments.

The capacitor array 151 are constructed and arranged for providing a total capacitance suitable for charging and discharging according to power requirements imposed on the inverter 118. The capacitors in the array 151 may be film capacitors, electrolytic capacitors, or the like for receiving a source of DC, storing a charge corresponding to the received source of DC, and providing a conditioned voltage, which is used by the IGBT modules 152 to produce an AC output. As shown in FIG. 7, the DC source may be a rectifier fed by a power grid 20, e.g., shown in FIG. 7, but not limited thereto. In other examples, the DC source can be a known source such as a battery, alternative power source. The capacitors 151 may have a cylindrical, rectangular, or other configuration. The capacitors 151 may have a same, similar, or different configuration with respect to each other.

In some embodiments, the IGBT modules 152 function as high power switches. Although IGBT modules are shown and described, other high power semiconductor switching devices can equally apply. The IGBT modules 152 include a plurality of connectors or terminals 111 for example, for coupling DC+ and DC− bus bars to the IGBT modules 152.

The gate driver board 153 is coupled to the gates of the IGBT modules 152. A controller 112 (see FIGS. 2B and 7) can provide control signals to the gate driver board 153 so that the gate driver board 153 can control the operating mode of the IGBT modules 152, for example, convert the DC voltage applied from the capacitor bank 151 to AC, where resulting AC is output from the inverter via AC terminals 111. The controller 112 may be include a special purpose computer processor and memory for processing signals that are output to the IGBT modules 152, e.g., AC waveforms, for performing a conversion function according to the received signals from a system controller.

Figure 6:
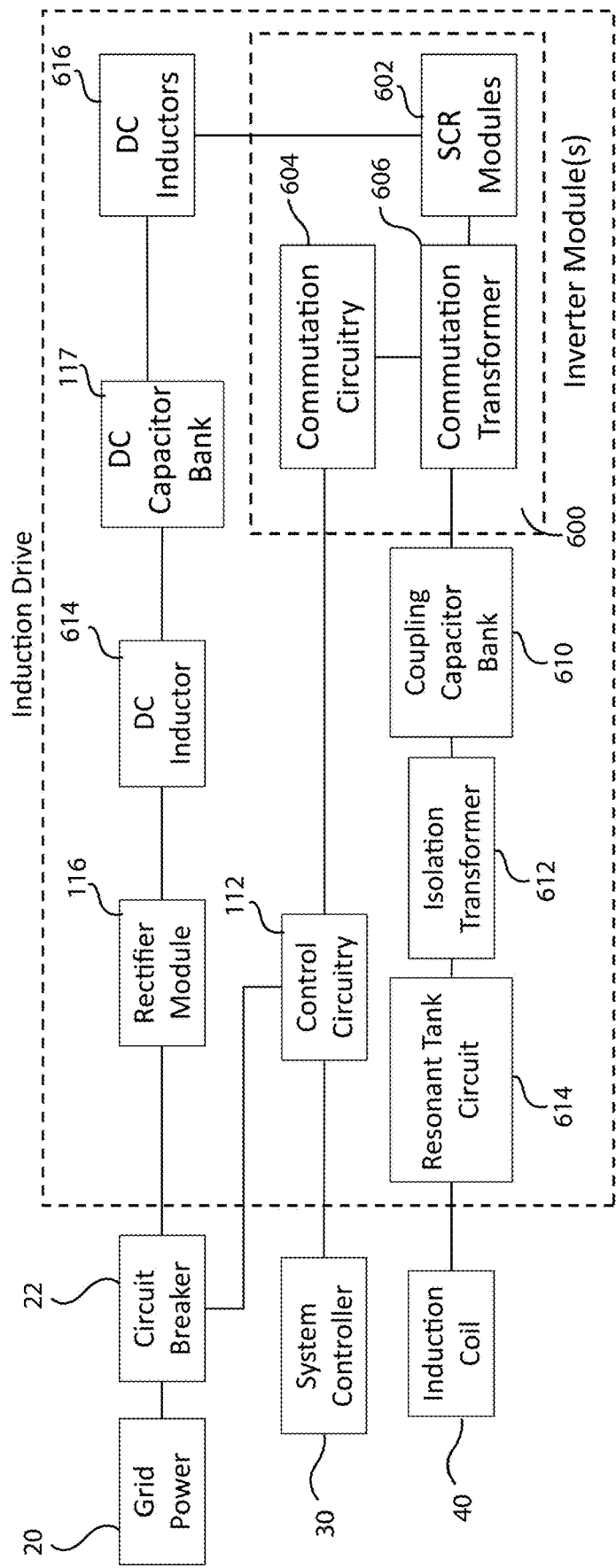
FIG. 6 is a block diagram of a silicon controlled rectifier (SCR) and resonant tank drive of a conventional induction drive.

Conventional induction heating systems use silicon controlled rectifier (SCR) or related thyristor power circuits for electromagnetic induction. As shown in FIG. 6, a conventional inductive drive includes inverter modules 600, each including a plurality of SCR modules 602, commutation circuitry 604, and a commutation transformer 606. The commutation circuitry 604 receives signals from the control circuit 112 to control the operation of the inverter 600. Among the functions of the commutation circuitry 604 is the application of drive pukes of the proper frequency to the SCR modules 602 based on feedback from the commutation transformer 606. During operation, the SCR inverter 600 switches on and off to generate an AC output to the induction coil 40. A coupling capacitor bank 610 is required to allow the SCR module 602 to resonate with the transformer 612 and tank circuit 614 and ensure a zero crossing for the current waveform. An isolation transfer 612 is needed to step up the current between the SCR circuit 602 and the resonant tank circuit 614. The tank circuit 614 is tuned to resonate at the desired frequency with the inductance of the specific load connected to the drive, and required to ensure that the current waveform to the coil is sinusoidal, allowing the SCRs to switch at zero current. However, the operation of the SCR inverter 600 working in concert with the large, complex, resonant tank circuit 614 is a load-resonant configuration, and requires a tuned capacitance with respect to the load capable of delivering hundreds of amperes, which requires complex, expensive components.

Also, the SCR modules 602 operate in a zero crossing control mode for accommodating fast, full power on/off cycling, where the SCR modules 602 are turned on when the instantaneous value of the sinusoidal current is zero. However, complex circuits are required to control the on time of the SCRs 602 with sufficient accuracy.

As shown in FIG. 7, the induction drive in some embodiments, includes IGBT modules 152 that overcome the abovementioned problems associated with SCR modules. Accordingly, the induction drive 10 shown in FIGS. 1A-5C and 7 permits the induction coil load to maintain its magnetic properties, allowing for a lower operating environment in view of the various market requirements.

Another benefit of IGBT modules 152 over SCR modules is that SCRs cannot prevent current flowing without intervening electronics. In particular, SCRs may prevent current flowing when in an off state, but if given a command to switch off while current is flowing, the SCRs will continue to conduct until the current is reduced to zero by an external driver, referred to as a zero crossing issue. The IGBT modules 152, on the other hand, are capable of interrupting current on their own.

Another issue with SCRs is that since SCRs cannot stop current flow, they have to switch in time with the desired current output wave. This means that the voltage waveform output from the SCRs must be in time with the current waveform as well, since the voltage on time is limited to the current on time. The IGBT modules 152 can operate at any power factor, since they do not have this switching limitation and do not require proper phasing between voltage and current.

Another benefit of IGBT modules 152 is that no tank circuit is required to generate a sinusoidal output, required for the induction coil 40. Without the tank circuit 614 in FIG. 6, the current would just increase while the SCR modules 602 are on, and will not come back down to zero. By using a resonant circuit, the SCRs 602 are providing the impetus to the resonant tank, which will drive itself to a sinusoidal waveform and allow the SCRs 602 to turn on and off in time with the output. The IGBT modules 152 on the other hand can simply turn off while current is flowing to define the peak of the current waveform. Thus, an SCR drive must be constructed with a tank capacitor bank sized to match a given load coil. A given configuration of SCR based drive can only be used with the correct load coil.

Also, as described below, a clean sinusoidal AC current is not needed by a high inductance load. Also, the IGBT modules 152 are preferable for switching speed (several frequencies v. fundamental output).

The IGBT modules function to improve flexibility to the drive 10 since they do not need to be tuned to the load of the induction coil 40, as described above.

Figure 4A:
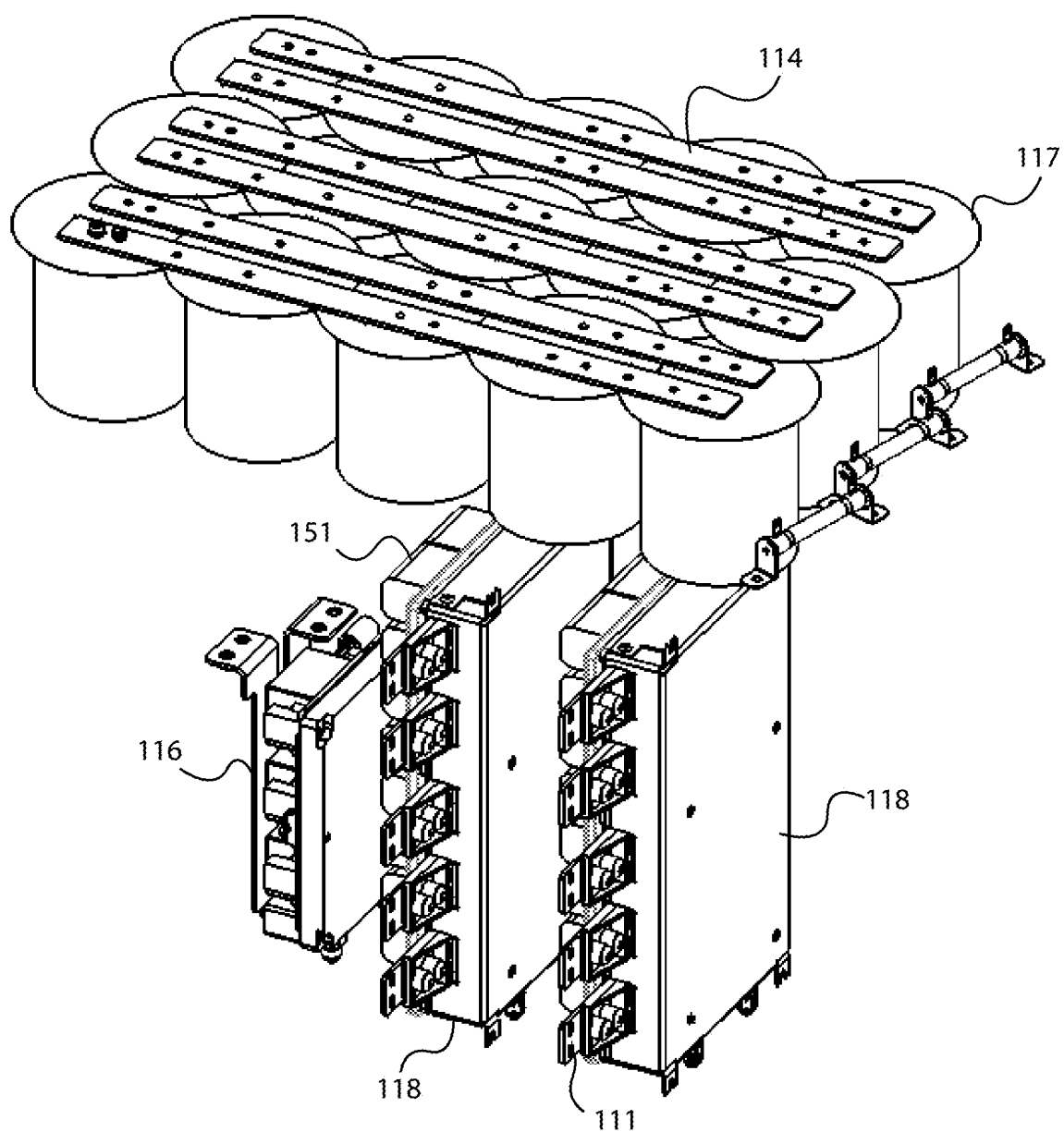
FIG. 4A is a perspective view of elements of the interior of the induction drive system of FIGS. 1A-1C, 2A, and 2B.
Figure 4B:
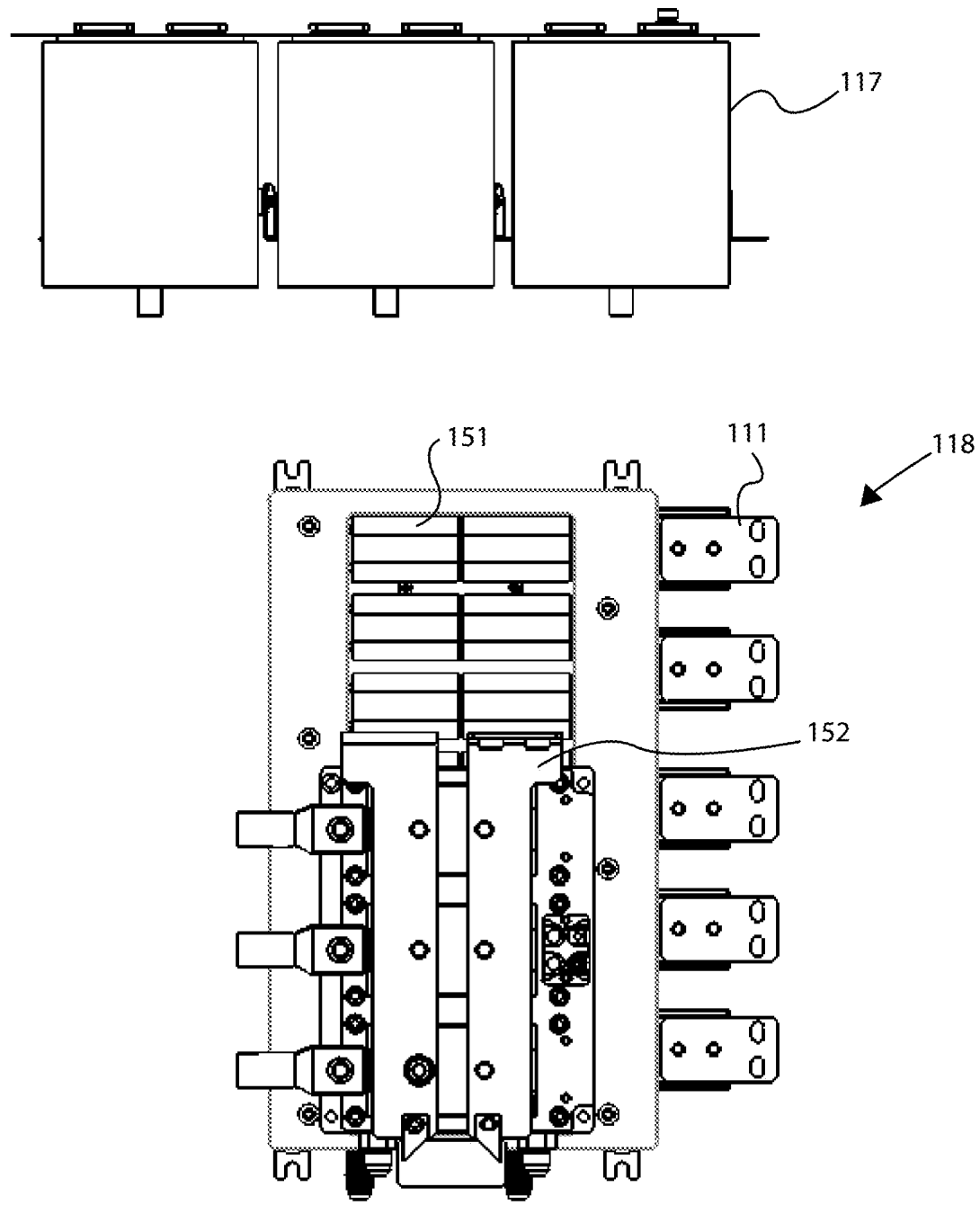
FIG. 4B is a side view of elements of the interior of the induction drive system of FIGS. 1A-1C, 2A, 2B, and 4A.
Figure 5A:
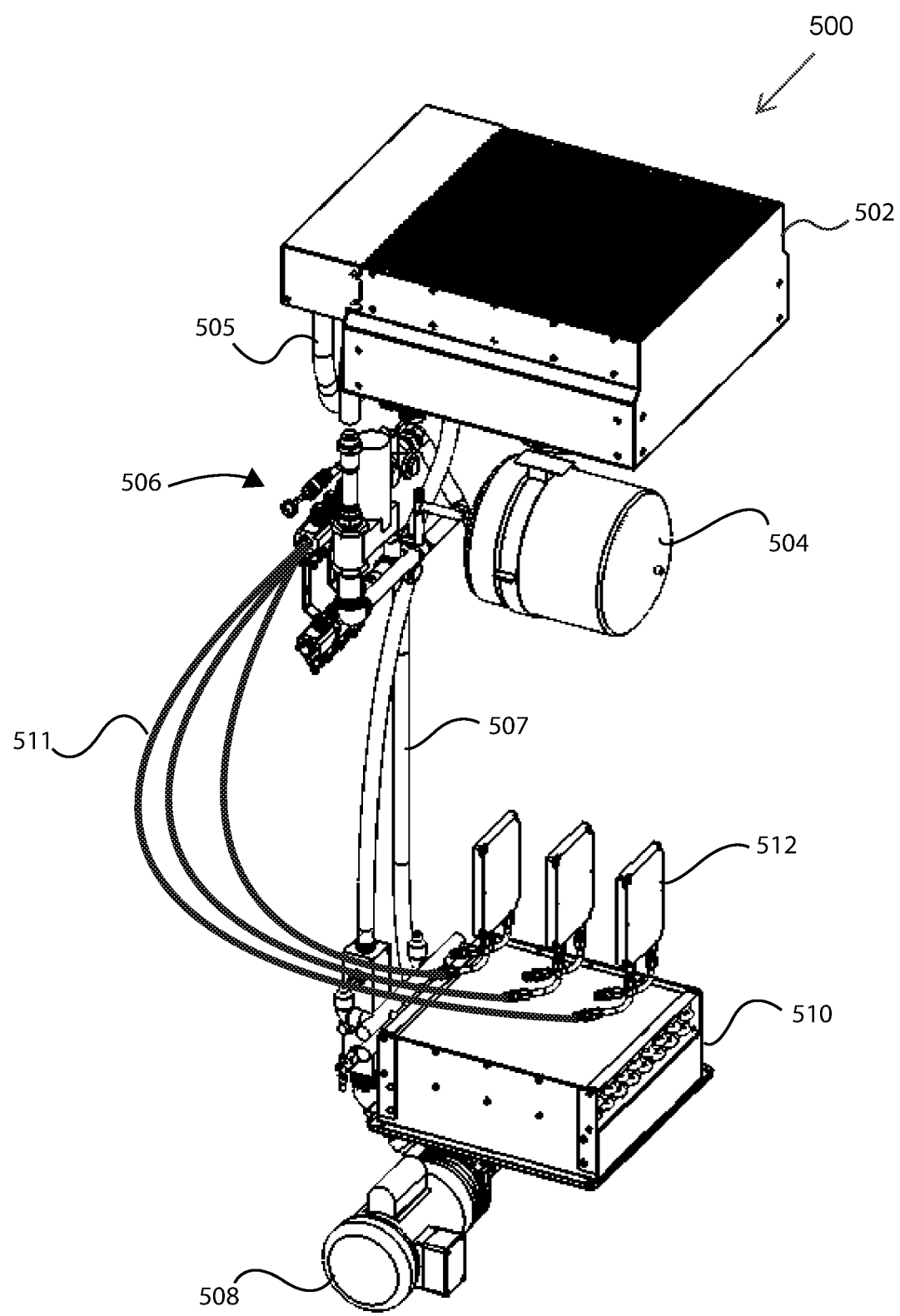
Figure 5D:
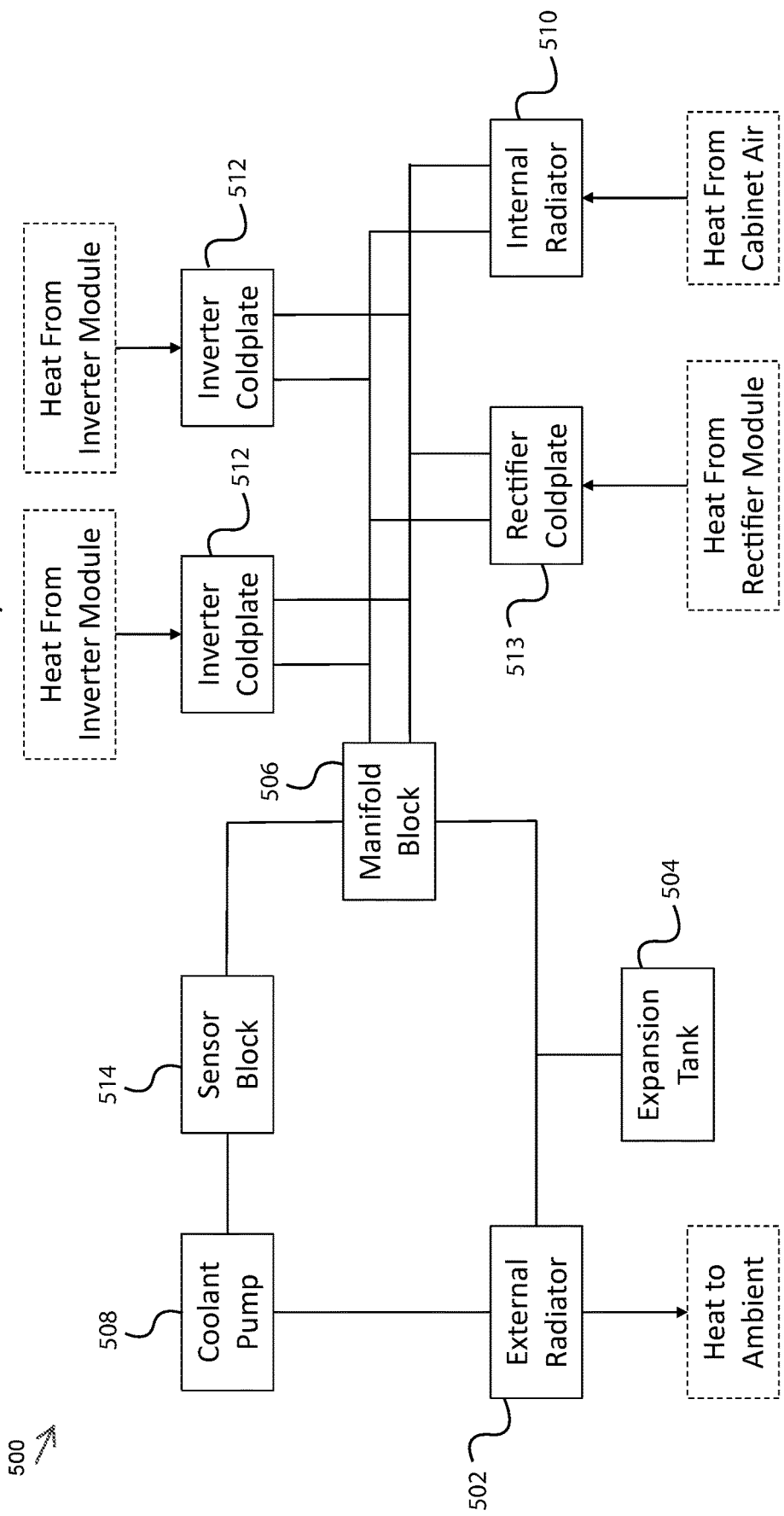
FIG. 5D is a block diagram of the cooling system of the inductor system of FIGS. 1A-1C, 2A, 2B, and 5A-5C, in accordance with some embodiments.

As shown in FIG. 4A, the IGBT modules 152 may be arranged in parallel. Following previous examples, the system 10 may include an arrangement of two inverters 118, each having three modules 152 configured to perform switching operations in parallel, but is not limited thereto. Although two inverters 118 are shown and described, in other embodiments, more than two inventors 118 may equally apply.

Configuring the inverters in an H-Bridge configuration, with three IGBT modules 152 in one inverter module 118 parallel with each other, and the same in the other inverter 118, large currents are generated that flow between the two inverters 118A, 118B over the DC bus 114. In some configurations, one IGBT module 152 in the first inverter 118A is positioned in parallel with two IGBT modules 152 of the second inverter 118B, and vice versa, so that the DC current exchanged between the inverter modules is reduced and heat generated in the buswork 114 is likewise reduced and also provides a phase paralleling split between the IGBT modules 152 to reduce DC current ripple. Such a parallel arrangement is accomplished by the signals output from the control board 112 and the configuration of the AC buswork.

Figure 13:
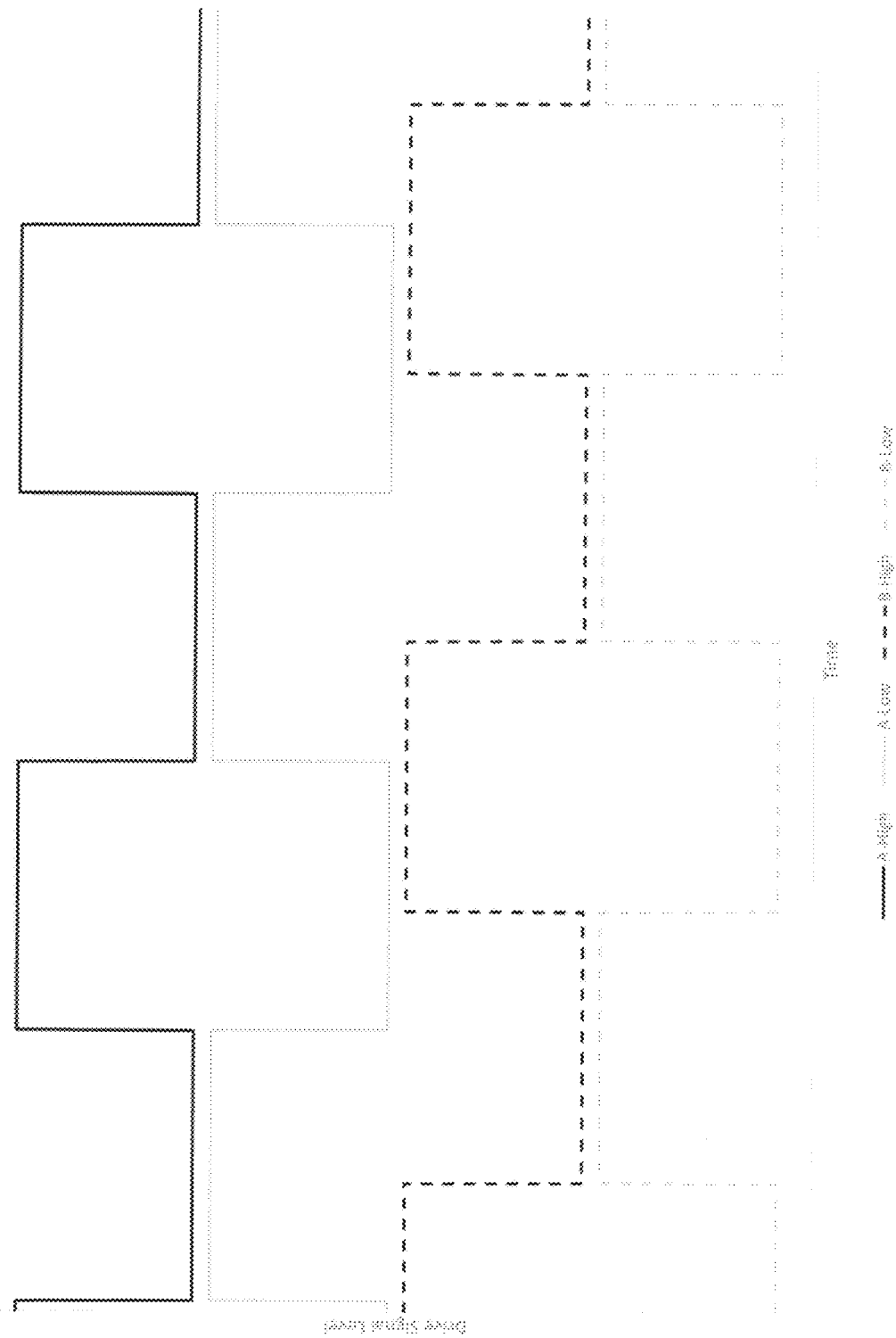
FIG. 13 is a graph of a waveform of drive signals, where a 80 degree phase shift is present between two inverter modules, in accordance with some embodiments.
Figure 14:
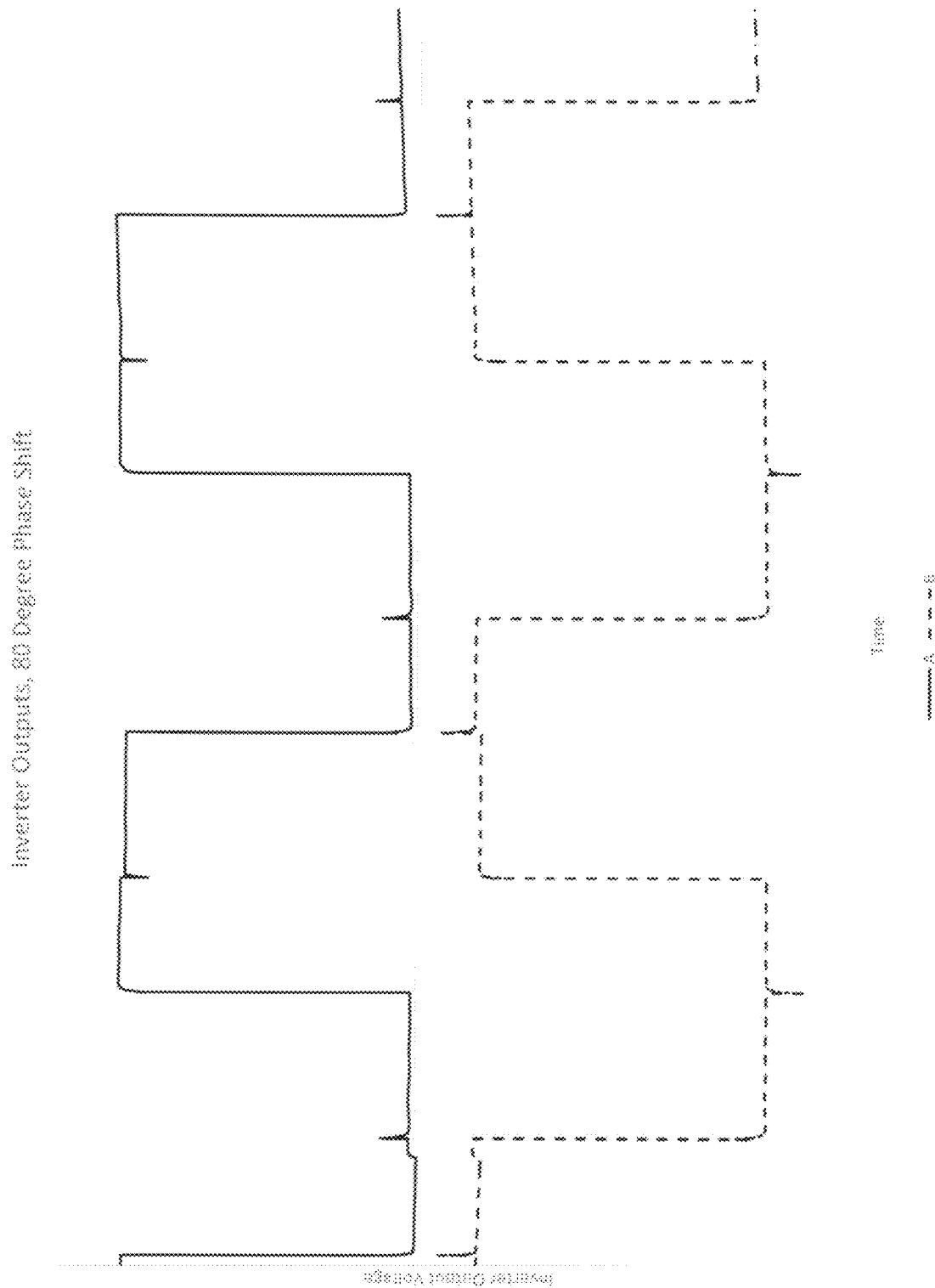
FIG. 14 is a graph of a waveform produced by two inverter modules according to the phase shift of FIG. 13, in accordance with some embodiments.

Another feature is that the an induction drive system 10 shown in FIGS. 1A-5C and 7 produces phase shifted square wave drive waveforms, for example, shown in FIGS. 13 and 14, which reduce losses in the IGBT modules 152, allowing for more power output.

FIG. 13 is a graph of a waveform of drive signals, where an 80 degree phase shift is present between two inverter modules, in accordance with some embodiments. FIG. 14 is a graph of a waveform produced by two inverter modules according to the drive signals of FIG. 13, in accordance with some embodiments. As described herein, the induction coil 40 does not require a sinusoidal current waveform. The waveforms of the IGBT modules 152 can be shifted, for example, 80 degrees in FIG. 13-16, or 160 in FIGS. 9-12, but not limited thereto, which can reduce switching losses, described below.

Figure 15:
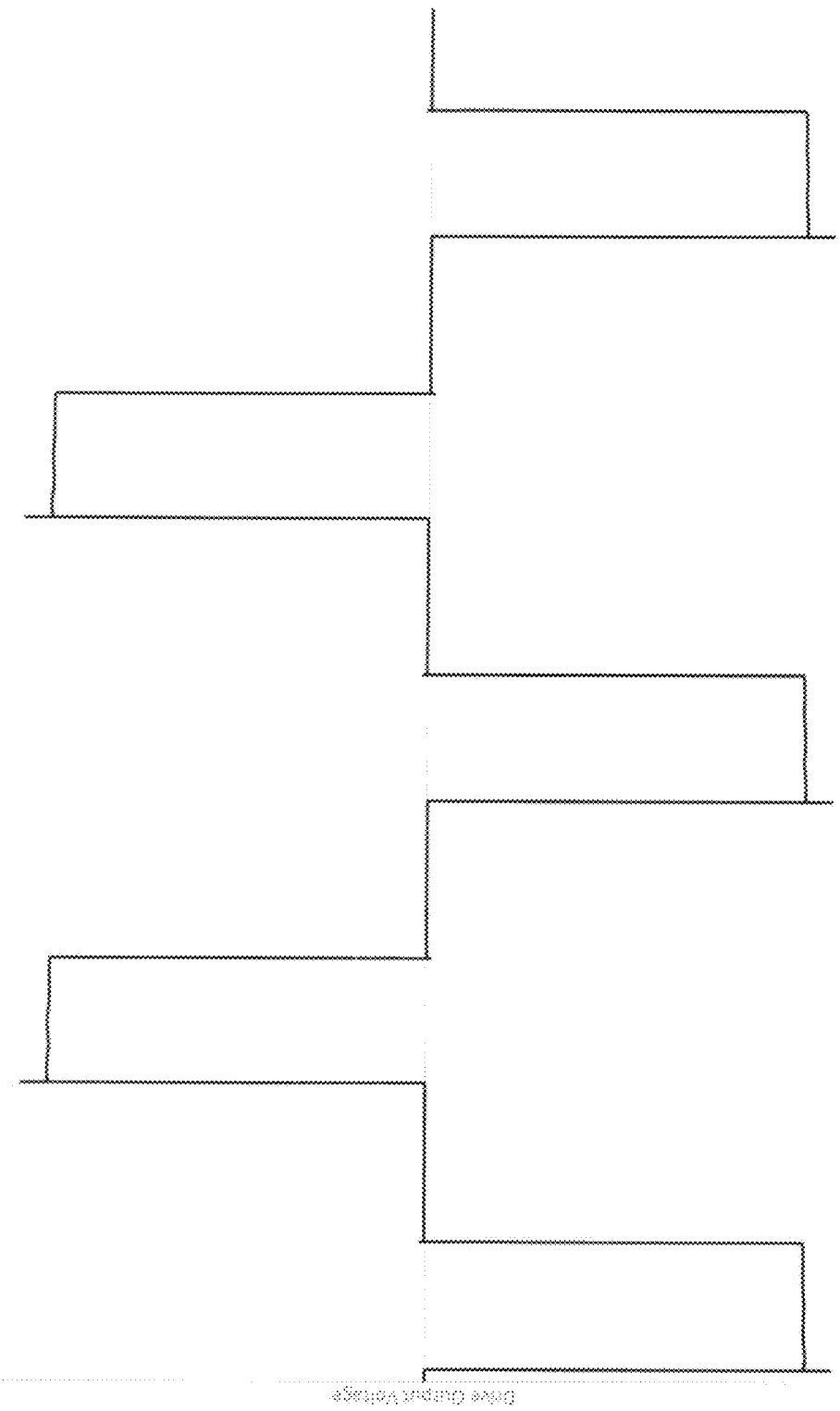
FIG. 15 is a graph of a drive output, in accordance with some embodiments.
Figure 16:
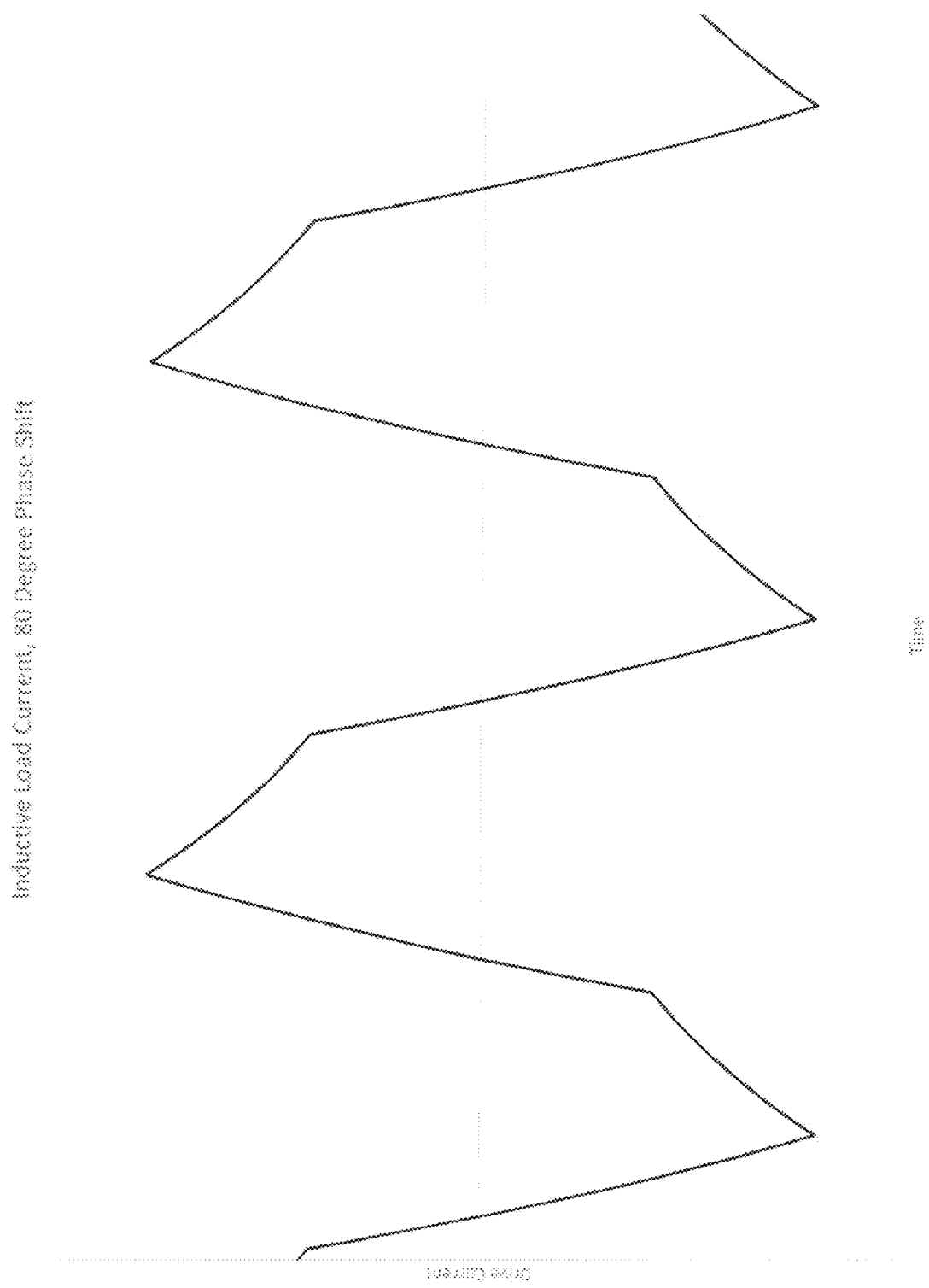
FIG. 16 is a graph of an inductive load current at an inductor between first and second inverter modules referred to in FIGS. 13-15.

As shown in FIGS. 13 and 14, an 80 degree phase shift is present between the first inverter 118A and the second inverter 118B due to the configuration of the IGBT modules 152. Here, The IGBT modules 152 are controlled by the control board 112. In some embodiments, software on the control board 112 generates the switching signals, and changes the phasing between them based on a power command generated by an external system controller 30. A sum of the waveforms of the first and second inverter modules 118A, 118B is shown in FIG. 15. FIG. 16 is a graph of an inductive load current between the first and second inverter modules 118A, 118B referred to in FIGS. 13-15. In particular, FIG. 15 shows the voltage waveform across the coil 40, and illustrates how the phase shifted inverter outputs create a stepped AC waveform. FIG. 16 shows the current through the coil 40, and illustrates how the high inductance of the coil 40 allows for the use of this control scheme. Without the assumption of high inductance for this application, the rate of rise of the current would be unacceptably high, and the configuration would need to limit the on time of the IGBT modules 152, which would reduce the power we can deliver to the load.

FIGS. 9-12 are similar to FIGS. 13-16, except that FIGS. 9-12 show graphs of a 160 degree phase shift. Although 80 and 160 degree phase shifts are shown, other phase shifts not shown may equally apply.

An inductive element is needed between the inverters and the power grid to prevent harmonics of the grid frequency and/or output frequency from affecting the grid itself. An SCR based drive also requires an inductive element(s) on the DC bus to limit the current drawn by the SCR devices during switching. An IGBT based system does not require this current limiting inductive element, allowing the use of an AC line reactor instead of DC inductors. An AC line reactor appropriate for the drive shown here is a readily available component, whereas the DC inductor(s) required by a SCR based drive are custom fabricated components designed for the specific drive cabinet. Using a line reactor instead of these inductors reduces manufacturing time and cost significantly. Another feature of the induction drive system 10 relates to phase shifted square wave control. The induction coil 40 does not require a sinusoidal current waveform. By limiting the application to steel below the curie temperature, the system 10 ensure that the inductance of the induction coil 40 remains high enough to allow for this switching scheme. Heating non-ferrous or taking ferrous materials too hot will reduce the inductance of the coil, and this switching method will allow the current to rise too fast when voltage is applied. Each IGBT module 152 switches at a 50% duty cycle and shifts the waveforms of the IGBT modules 152 relative to each other to control output. Phase shifted square wave control also allows the IGBT modules 152 to switch at the fundamental output frequency, reducing losses. In particular, when an IGBT module 152 performs a switching operation, a specific amount of energy is dissipated with each on-cycle and off-cycle of the operation. As is well known, switching power loss is proportional to the switching frequency. Switching at the fundamental frequency (100 Hz to 2 kHz) instead of a frequency capable of generating a clean sinusoidal waveform at the fundamental frequency (2.5 kHz to 20 kHz) translates to a significant improvement with respect to power dissipated in the system.

Another benefit is that electrical noise is eliminated at the switching frequency, reducing filtering requirements. When generating a sine wave using the normal approach, there is a ripple at the switching frequency superimposed on the nominal current sine wave. This can create excess heating in the driven component (in the induction coil winding rather than the steel in this specific load) if it isn't filtered out with added components in the drive. Switching at the fundamental frequency eliminates this superimposed frequency and eliminates the added filtering components.

Figure 17:
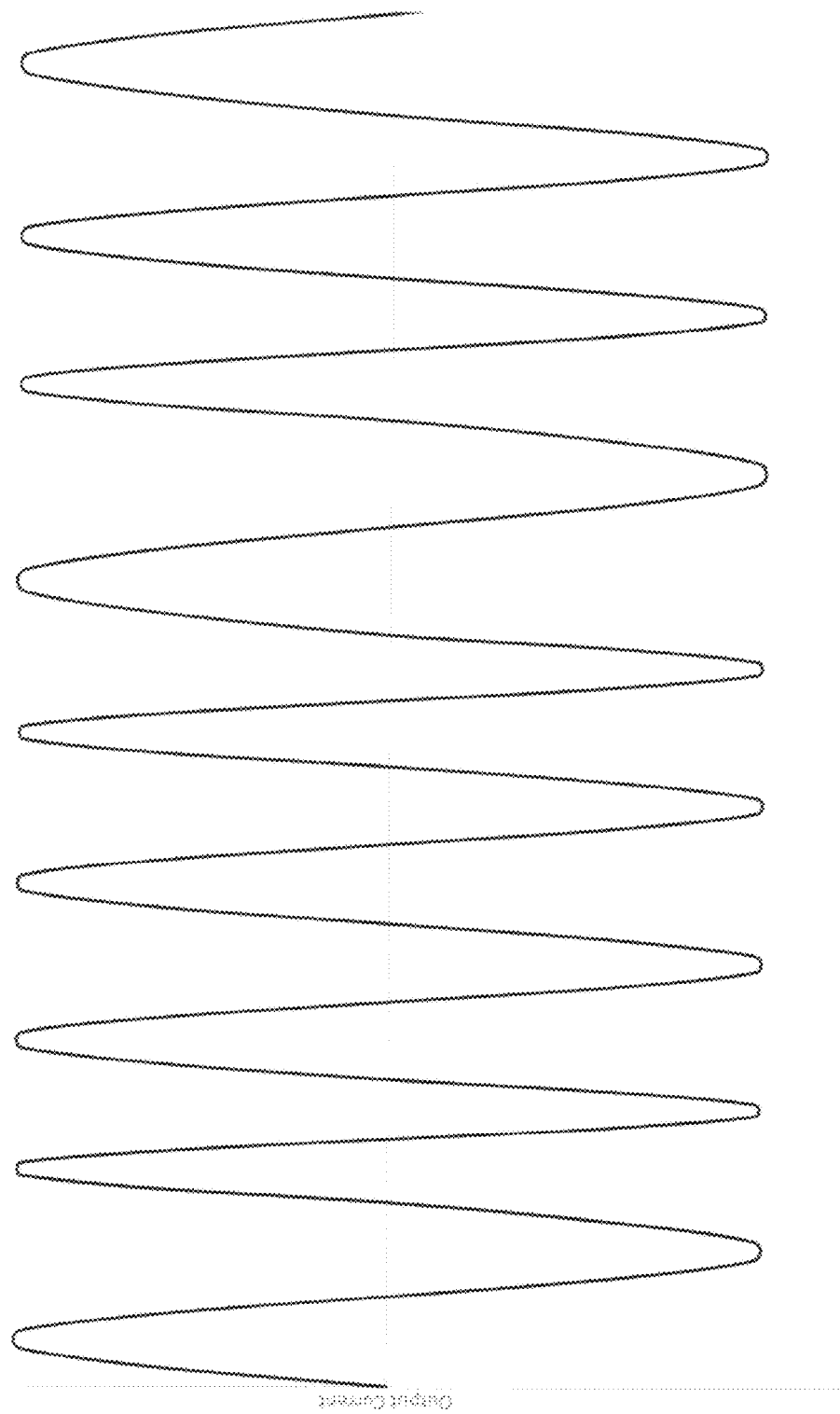
FIG. 17 is a graph of a random waveform period, in accordance with some embodiments.

A related feature is the production of a randomly varied waveform period, for example, shown in FIG. 17. As previously mentioned, phase shifted square wave control allows the IGBT modules 152 to switch at the fundamental output frequency. Accordingly, the fundamental output frequency is the switching frequency. In doing so, the audible noise output of the drive is determined by the fundamental frequency. The output frequency is randomly varied within a band from nominal, with a new frequency selected every wave period. Accordingly, this changes the audible noise from a single tone whine sound to white noise or the like. For example, FIG. 17 shows a waveform period of 1200 Hz. This can be adjusted by the control circuit 112, for example, varying the frequency at +/−30%.

Referring again to FIGS. 2B and 7, the control circuit 112 may include an interlock fault protection system 154, which may include hardware, software, or a combination thereof. The interlock fault protection system 154 is configured to monitor air temperature, coolant temperature/pressure/flow, cabinet door position, internal fluid presence, inverter module internal faults, control voltage, manual emergency stops, and so on. If any fault is detected, an interlock signal is generated and output to trip the main breaker 22 to the drive cabinet.

Figure 8:
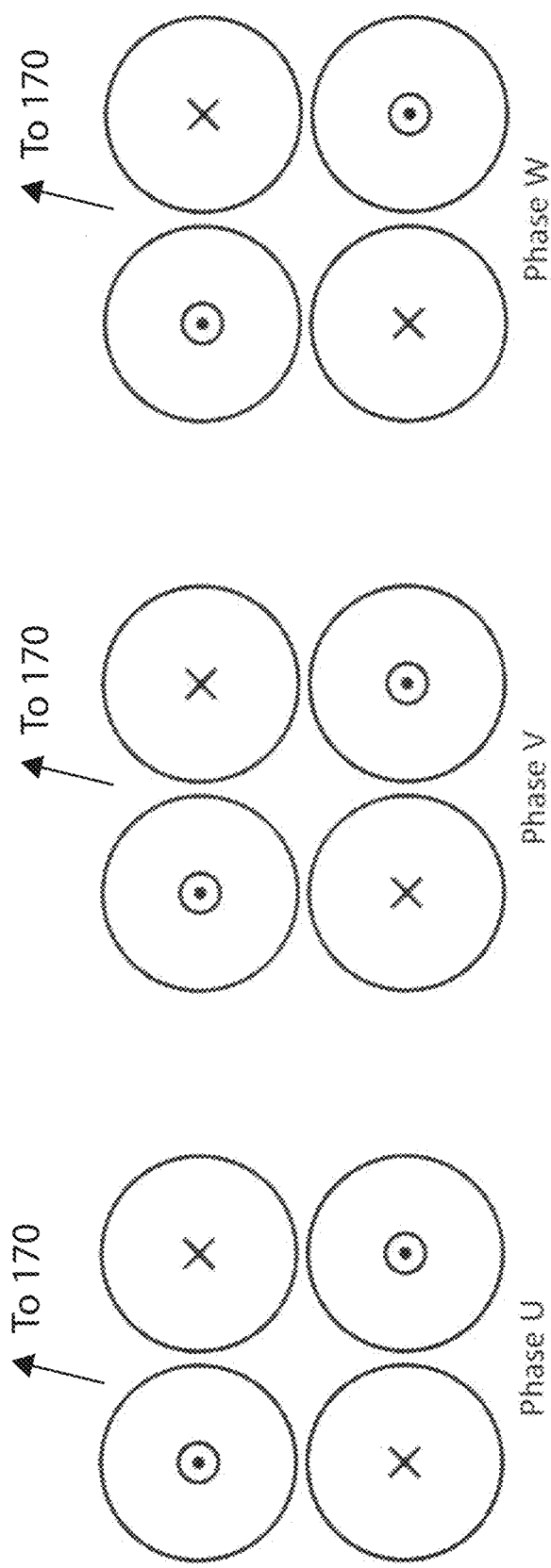
FIG. 8 is a view of a quadrature cable layout, in accordance with some embodiments.
Figure 9:
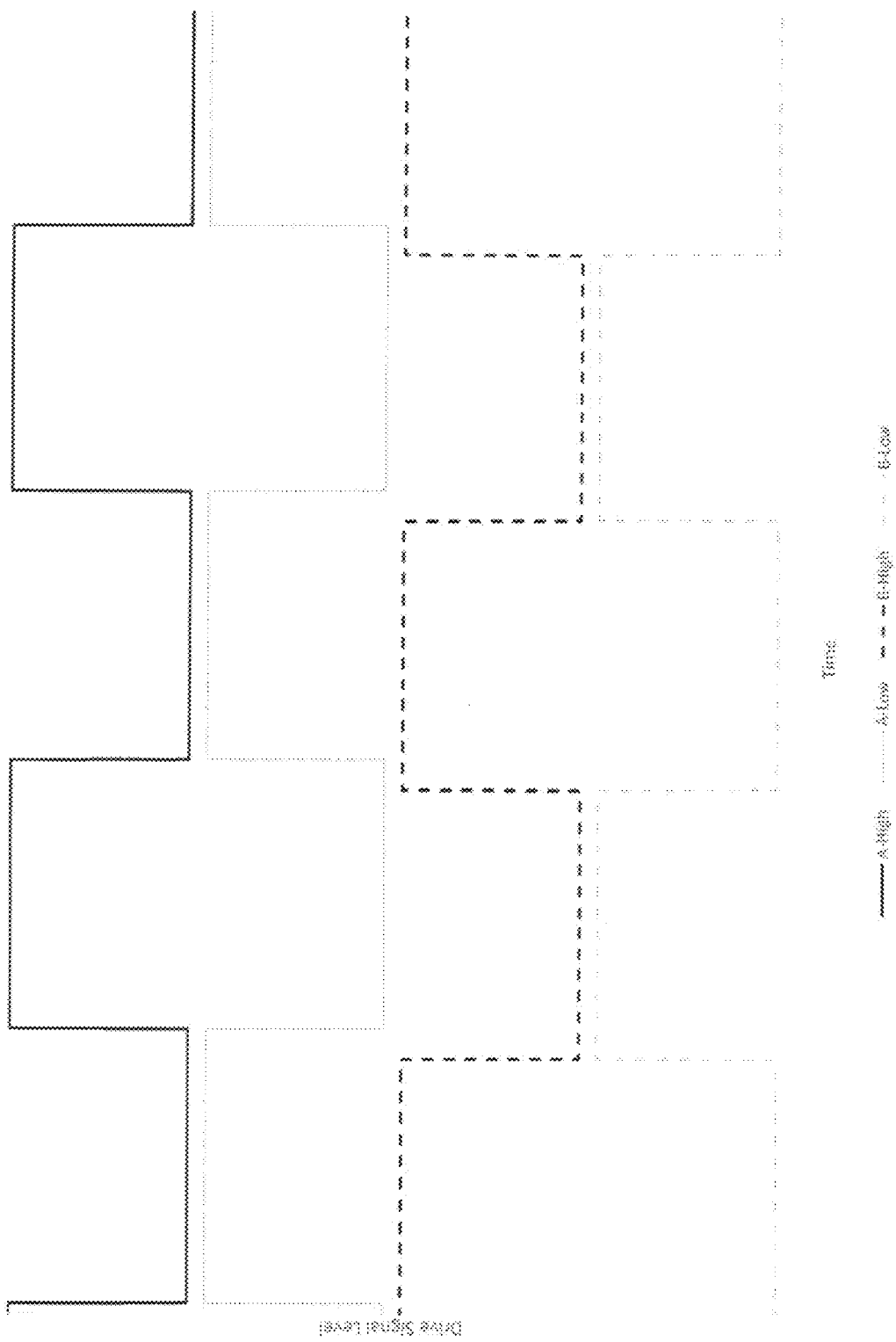
FIG. 9 is a graph of a waveform of drive signals, where a 160 degree phase shift is present between two inverter modules, in accordance with some embodiments.
Figure 10:
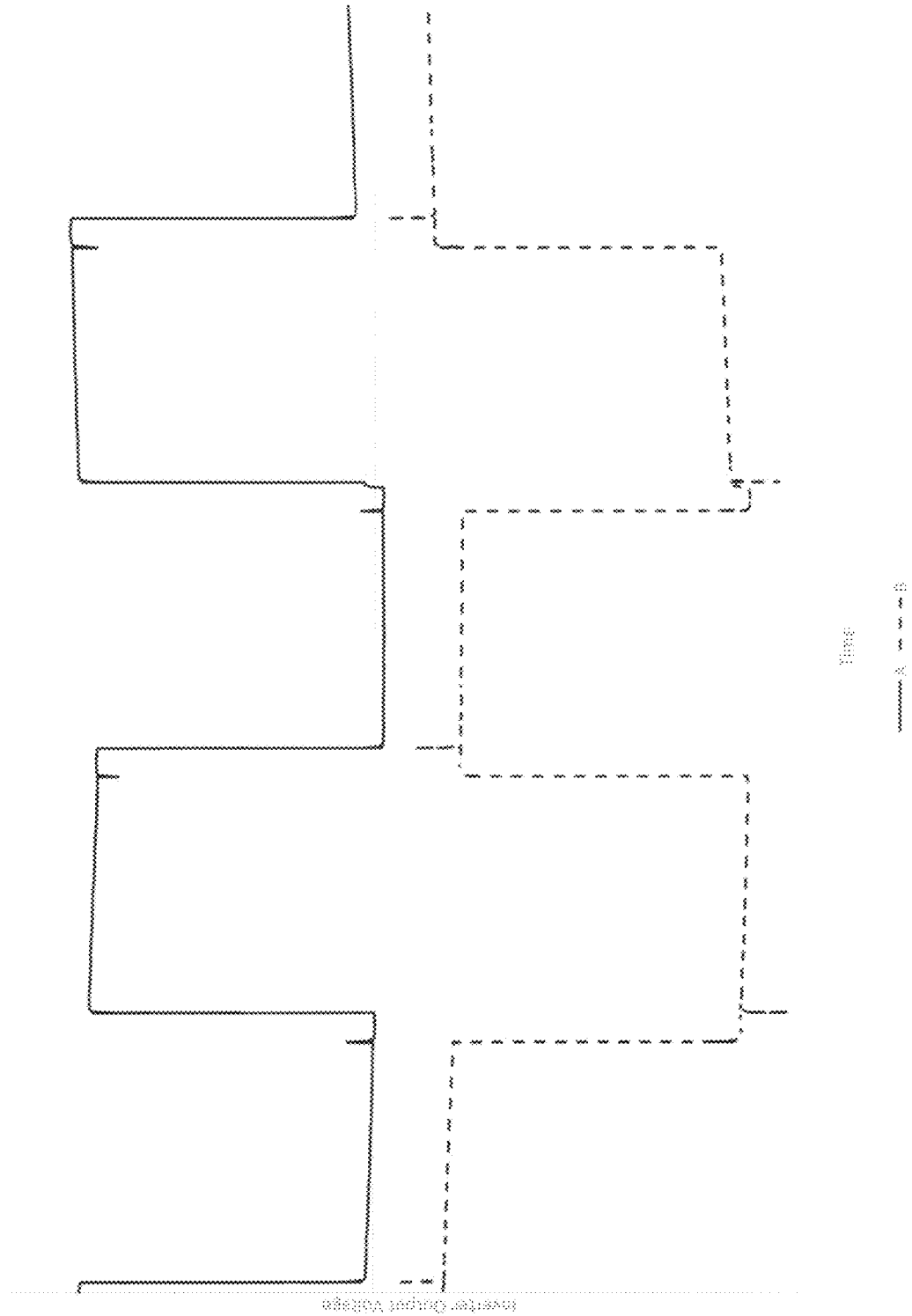
FIG. 10 is a graph of a waveform produced by two inverter modules according to the phase shift of FIG. 9, in accordance with some embodiments.
Figure 11:
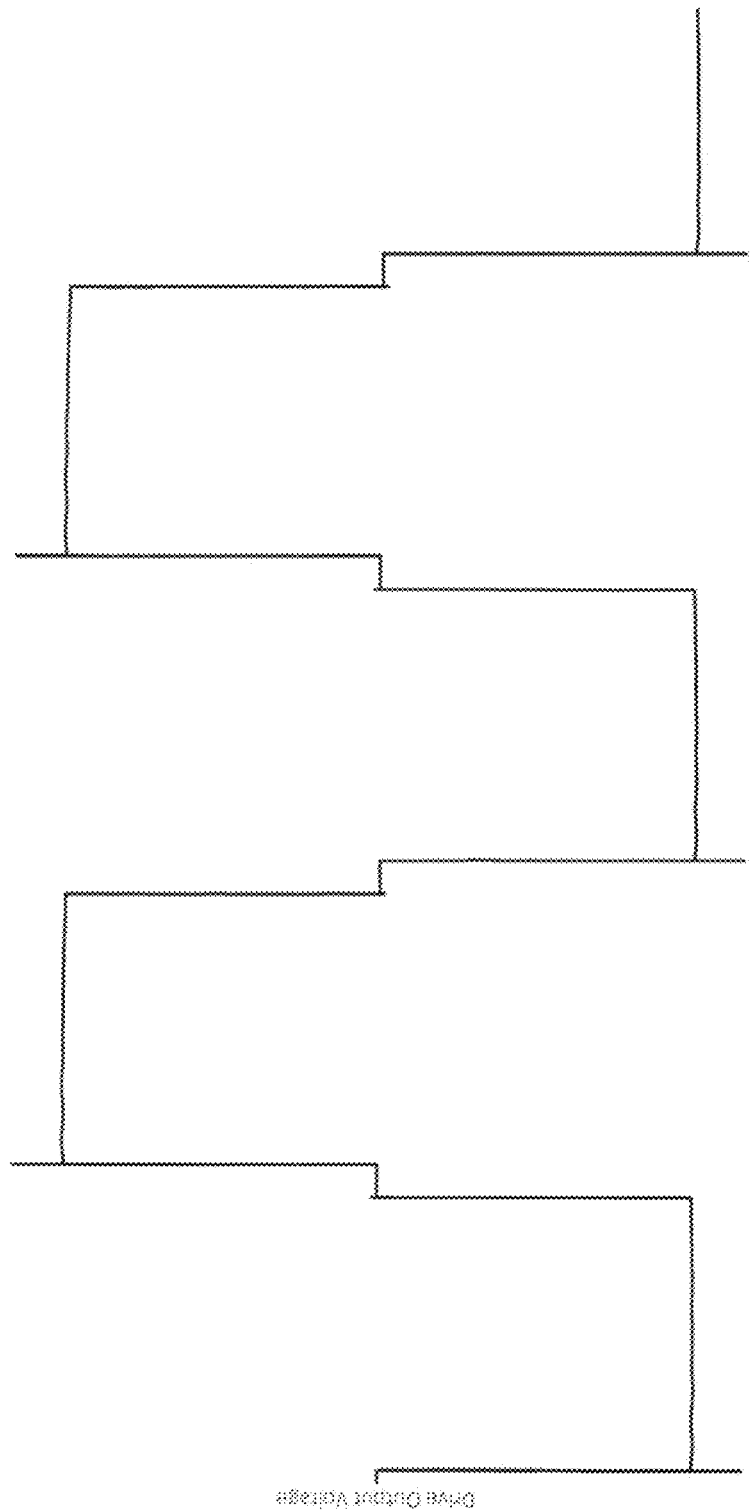
FIG. 11 is a graph of a drive output, in accordance with some embodiments.
Figure 12:
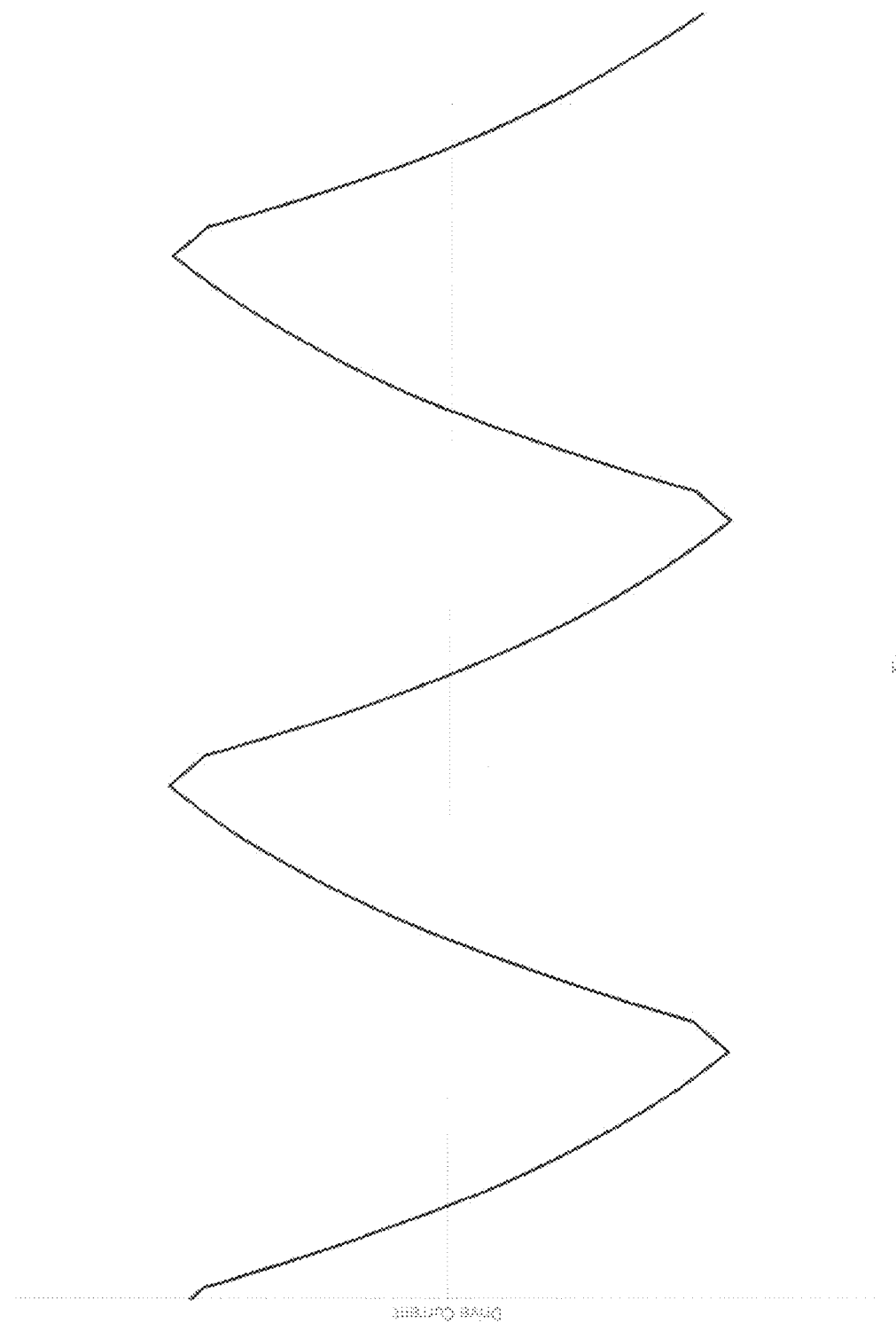
FIG. 12 is a graph of an inductive load current between the first and second inverter modules referred to in FIGS. 9-11.

FIG. 8 is a view of a quadrature cable layout, in accordance with some embodiments. The output terminals 122 shown in FIGS. 2A-2C are arranged to allow this wiring layout. Arranging cables in a quadrature pattern allows for the use of normal cable instead of litz or water cooled lead wires by reducing high frequency losses. The layout is constructed and arranged to cancel magnetic fields at high frequencies, which can reduce loss in the cables.

While concepts have been shown and described with reference to specific preferred embodiments, it should be understood by those skilled in the art that various changes in form and detail may be made therein without departing from the spirit and scope as defined by the following claims.

What is claimed is:
1. An induction drive system, comprising:
an enclosure;
a plurality of electronic components internal to the enclosure; and
a closed-loop cooling system including a heat dissipating component internal to the enclosure and coexisting with the plurality of electronic components inside the enclosure to cool the plurality of electronic components, wherein at least one of the plurality of electronic components is directly coupled to the heat dissipating component of the cooling system, the electronic components including first and second inverter modules arranged in parallel to each other to further reduce a source of heat generated in the enclosure, the first and second inverter modules between a coolant tank and a radiator of the cooling system to remove the source of heat generated by the electronic components in the enclosure.

2. The induction drive system of claim 1, constructed and arranged for an application directed to heating steel below a Curie temperature.

3. The induction drive system of claim 1, further comprising the two inverter modules that each includes:
- three insulated gate bipolar transistor (IGBT) modules for producing an AC output from a DC source, the AC output received by an induction coil external to the enclosure for heating a metal; and
- a capacitor array mounted over the IGBT modules that provides a conditioned voltage to the IGBT modules.

4. The induction drive system of claim 3, wherein the inverter modules are arranged in parallel in an H-Bridge configuration for forming a current flow through a single-phase or three-phase load between the legs of the H-Bridge.

5. The induction drive system of claim 3, wherein the three IGBT modules of each inverter module are parallel each other.

6. The induction drive system of claim 3, wherein the two inverter modules are arranged to provide a phase paralleling split between the IGBT modules of the inverter modules.

7. The induction drive system of claim 1, producing a randomly varied waveform period.

8. The induction drive system of claim 1, wherein the first and second inverter modules form a phase shift between them, and wherein the induction drive system further including a controller for controlling the phase shift.

9. The induction drive system of claim 1, further including a line reactor power filtering device.

10. A tankless closed-loop cooling system for an electronic assembly of an induction system comprising a plurality of insulated gate bipolar transistor (IGBT) power modules and rectifier modules, comprising:
- an enclosure that houses the electronic assembly of the induction system;
- at least one inverter coldplate that coexists with the electronic assembly in the enclosure and that receives a source of heat from the (IGBT) power modules;
- at least one rectifier coldplate that coexists with the electronic assembly in the enclosure and that receives a source of heat from the rectifier modules;
- a manifold block in the enclosure that is in thermal communication with the at least one inverter coldplate and the at least one rectifier coldplate; and
- a coolant pump that coexists with the electronic assembly in the enclosure and that provides a source of cooling fluid via the manifold block to the at least one inverter coldplate and the at least one rectifier coldplate.

11. The tankless closed-loop cooling system of claim 10, further comprising:
- a radiator that coexists with the electronic assembly in the enclosure that in combination with the source of cooling fluid removes heat from the enclosure.

* * * * *